(12) United States Patent
Kwak

(10) Patent No.: US 8,638,603 B2
(45) Date of Patent: Jan. 28, 2014

(54) DATA STORAGE SYSTEM HAVING MULTI-LEVEL MEMORY DEVICE AND OPERATING METHOD THEREOF

(75) Inventor: DongHun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 81 days.

(21) Appl. No.: 13/466,280

(22) Filed: May 8, 2012

(65) Prior Publication Data

US 2012/0320673 A1 Dec. 20, 2012

(30) Foreign Application Priority Data

Jun. 16, 2011 (KR) .................. 10-2011-0058312

(51) Int. Cl.
*G11C 11/34* (2006.01)
*G11C 16/04* (2006.01)
*G11C 7/10* (2006.01)

(52) U.S. Cl.
USPC ............ 365/185.03; 365/185.05; 365/185.11; 365/189.05

(58) Field of Classification Search
USPC .............. 365/185.03, 185.05, 185.11, 189.05
See application file for complete search history.

(56) References Cited

U.S. PATENT DOCUMENTS

| | | | |
|---|---|---|---|
| 7,646,664 B2 | 1/2010 | Cho et al. | |
| 7,706,181 B2 | 4/2010 | Byun et al. | |
| 7,812,390 B2 | 10/2010 | Park et al. | |
| 8,437,183 B2 * | 5/2013 | Sharon et al. | 365/185.01 |
| 2007/0211530 A1 | 9/2007 | Nakano | |
| 2008/0023747 A1 | 1/2008 | Park et al. | |
| 2008/0084729 A1 | 4/2008 | Cho et al. | |
| 2010/0172179 A1 * | 7/2010 | Gorobets et al. | 365/185.09 |
| 2011/0157981 A1 * | 6/2011 | Sharon et al. | 365/185.03 |
| 2013/0031431 A1 * | 1/2013 | Sharon et al. | 714/719 |

FOREIGN PATENT DOCUMENTS

| | | |
|---|---|---|
| JP | 2007-242163 | 9/2007 |
| JP | 2010-526395 A | 7/2010 |
| KR | 10-2007-0092642 A | 9/2007 |
| KR | 10-2008-0097646 A | 11/2008 |
| KR | 10-2011-0001098 | 1/2011 |

* cited by examiner

*Primary Examiner* — Ly D Pham

(74) *Attorney, Agent, or Firm* — Muir Patent Consulting, PLLC

(57) ABSTRACT

A method for a data storage system is disclosed. The method includes providing a memory cell array, and providing N blocks in a first region of the memory cell array, N being an integer greater than 1. Each cell of each block of the N blocks is configured to store no more than N−1 bits of data. The method further includes providing a block in the second region of the memory cell array. Each cell of the block in the second region is configured to store N bits of data. The method additionally includes configuring the data storage system so that when data is programmed to the memory cell array, N pages of the data are initially stored in N respective blocks of the first region of the memory cell array, and then the N pages of the data are stored in the block of the second region.

20 Claims, 24 Drawing Sheets

Fig. 5

| WL | 1-step PGM | 2-step PGM | 3-step PGM |
|---|---|---|---|
| 63 | D188, D189 | D191 | |
| 62 | D185, D186 | D190 | |
| 61 | D182, D183 | D187 | |
| ⋮ | ⋮ | ⋮ | ⋮ |
| 3 | D8, D9 | D13 | |
| 2 | D5, D6 | D10 | |
| 1 | D2, D3 | D7 | |
| 0 | D0, D1 | D4 | |

Fig. 10

| RD Data | BLK Address | Selected WL | | Unselected WL | |
|---|---|---|---|---|---|
| | | WL | Voltage | WL | Voltage |
| D0 | BLK0 | WL0 | Vrd | WL1~WL63 | Vread |
| D1 | BLK1 | WL0 | Vrd | WL1~WL63 | Vread |
| D4 | BLK2 | WL0 | Vrd | WL1~WL63 | Vread |

Not Change     Not Change

Fig. 11

| RD Data | BLK Address | Selected WL | | Unselected WL | |
|---|---|---|---|---|---|
| | | WL | Voltage | WL | Voltage |
| D0 | BLK0 | WL0 | Vpgm | WL1~WL63 | Vpass |
| D1 | BLK1 | WL0 | Vpgm | WL1~WL63 | Vpass |

Not Change     Not Change

DATA STORAGE SYSTEM HAVING MULTI-LEVEL MEMORY DEVICE AND OPERATING METHOD THEREOF

CROSS-REFERENCE TO RELATED APPLICATIONS

This application claims the benefits of priority, under 35 U.S.C §119, to Korean Patent Application No. 10-2011-0058312 filed Jun. 16, 2011, the entirety of which is incorporated by reference herein.

BACKGROUND

Exemplary embodiments relate to a memory device, and more particularly, relate to a data storage system including a multi-level memory device.

Semiconductor memory devices may be generally classified into volatile memory devices and non-volatile memory devices. Volatile memory devices may lose stored contents at power-off, while non-volatile memory devices may retain stored contents even at power-off. Nonvolatile memory devices may be formed of various types of memory cell transistors. Nonvolatile memory devices may include a flash memory device, a Ferroelectric Random Access Memory (FRAM) device, a Magnetic RAM (MRAM), a Phase change RAM (PRAM), or the like.

As a nonvolatile memory device, the flash memory device may be divided into NOR type flash memory devices and NAND flash memory devices according to connection relationships of memory cells and bit lines. The NOR flash memory device may have a structure in which two or more memory cell transistors are connected to one bit line in parallel. Accordingly, the NOR flash memory device may have excellent characteristics relating to random access time. On the other hand, the NAND flash memory device may have a structure in which two or more memory cells are connected to one bit line in series. This structure is called the cell string structure. One cell string may necessitate one bit line contact. Accordingly, the NAND flash memory devices may have excellent characteristics relating to integration.

Memory cells of flash memory device may be determined as ON cells or OFF cells according to a threshold voltage distribution. ON cells may represent erased cells, and OFF cells may represent programmed cells. A programmed memory cell may have one threshold voltage belonging to one of threshold voltage distributions each corresponding to N program states (or, programmed data values) (N being an integer of 1 or more).

At programming, the coupling effect may be caused between selected memory cells and adjacent memory cells. The coupling effect may make a threshold voltage distribution corresponding to the selected memory cells become wide and a margin between adjacent threshold voltage distributions become narrow. Such a coupling effect may be called the "electric field coupling" or "F-poly coupling". If variation of a threshold voltage distribution corresponding to the selected memory cells and reduction of a margin between adjacent threshold voltage distributions are caused due to the coupling effect, it may be difficult or impossible to reliably read data from memory cells. This problem may increase in proportion to an increase in the number of data bits being stored per cell.

SUMMARY

In one embodiment, a data storage system is disclosed. The data storage system includes a nonvolatile memory device including a memory cell array, and a memory controller configured to control the nonvolatile memory device. The memory cell array includes a first region configured for storing up to N−1-bit data (N being an integer greater than 1) per memory cell and a second region configured for storing N-bit data per memory cell, the first region including N memory blocks. The memory controller is configured to control the nonvolatile memory device to perform a buffer program operation in which N-bit data to be stored in the second region is divisionally stored in the N memory blocks of the first region, and a main program operation in which the N-bit data stored in the first region is stored in the second region. The memory controller is configured to control the nonvolatile memory device to divisionally store, during the buffer program operation, the N-bit data at a word line of each of the N memory blocks of the first region disposed at the same relative location, with respect to each block, as a word line of the second region in which the N-bit data is to be stored.

In another embodiment, an operating method of a data storage system is disclosed. The data storage system includes a nonvolatile memory device having a memory cell array divided into a first region and a second region, and a memory controller configured to control the nonvolatile memory device. The operating method includes performing a first program operation in which N-bit data (N being a positive integer greater than 1) to be stored in the second region is divisionally stored in each of at least N memory blocks included in the first region, and performing a second program operation in which the N-bit data stored in the first region is stored in the second region. Performing the first program operation includes divisionally storing the N-bit data at a word line of each of the N memory blocks of the first region disposed at the same location relative to the memory block in which it is included as a word line of the second region in which the N-bit data is to be stored.

In a further embodiment, a method for a data storage system is disclosed. The method includes providing a memory cell array, and providing N blocks in a first region of the memory cell array, N being an integer greater than 1. Each cell of each block of the N blocks is configured to store no more than N−1 bits of data. The method further includes providing a block in the second region of the memory cell array. Each cell of the block in the second region is configured to store N bits of data. The method additionally includes configuring the data storage system so that when data is programmed to the memory cell array, N pages of the data are initially stored in N respective blocks of the first region of the memory cell array, and then the N pages of the data are stored in the block of the second region.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a diagram showing an exemplary address scramble manner of a multi-bit memory device which stores 3-bit data per cell and to which a 3-step reprogram method is applied, according to certain embodiments.

FIGS. 10 and 11 are diagrams illustrating a bias condition at a parallel buffer program operation according to an exemplary embodiment.

DETAILED DESCRIPTION

Figure 1:
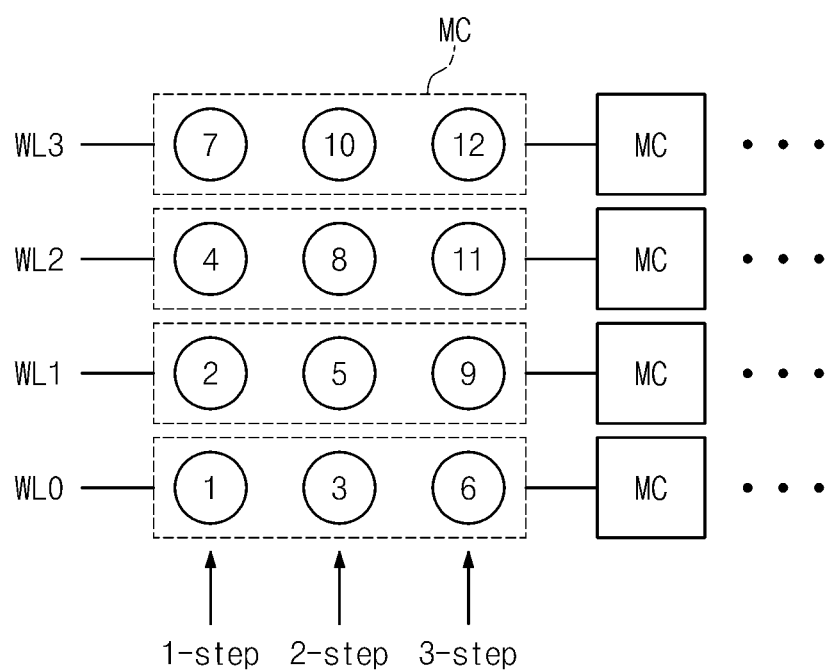
FIG. 1 is a diagram illustrating an address scramble manner applied to a multi-level memory device.

The present disclosure is described more fully hereinafter with reference to the accompanying drawings, in which various embodiments are shown. This inventive concept may, however, be embodied in many different forms and should not be construed as limited to the embodiments set forth herein. In the drawings, the size and relative sizes of layers and regions may be exaggerated for clarity. Like numbers refer to like elements throughout. The terminology used herein is for the purpose of describing particular embodiments only and is not intended to be limiting of the inventive concept.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings disclosed herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating an address scramble manner applied to a multi-level memory device.

With an increase in the number of data bits stored in each memory cell, it is increasingly difficult to secure the reliability of a memory device storing multi-bit (or, multi-level) data, which is called a multi-level memory device, hereinafter. A representative one of factors causing degradation of the reliability may be a variation of threshold voltages due to the coupling between adjacent memory cells. For example, a threshold voltage of a previously programmed memory cell may be varied due to the coupling caused when a memory cell adjacent to a programmed memory cell is programmed. An example of an address scramble manner may be applied to a multi-level memory device to manage the coupling effectively.

An address scramble manner will be described under the assumption that 3-bit data is stored in one memory cell. For ease of illustration, in FIG. 1, there are illustrated only four word lines WL0 to WL3 of a memory device. A plurality of memory cells MC may be connected with each word line.

For the memory device, there may be performed a 1-step program operation (i.e., a first program operation step) in which an initial number of bits of data, such as two bits of data (e.g., lower 2-bit data) are stored to each memory cell in the first word line WL0. For example, during the 1-step program operation, 2-page data may be stored in the memory cells connected with the first word line WL0. This is marked 1 in FIG. 1. Then, a 1-step program operation may be made with respect to memory cells connected with the second word line WL1. This is marked by ② in FIG. 1.

After the 1-step program operation is performed with respect to memory cells connected with the second word line WL1, a coarse program operation (also called a second program operation, or 2-step program operation) may be made with respect to the first word line WL0 which is placed below the second word line WL1 and in which lower 2-bit data is programmed. This is marked by ③ in FIG. 1. During the coarse program operation, a third bit of data (e.g., an upper 1-bit data) may be stored in memory cells connected with the first word line WL0. Following the 2-step program operation of memory cells connected with the first word line WL0, the 1-step program operation may be made with respect to the third word line WL2. This is marked by ④ in FIG. 1.

After the 1-step program operation for memory cells connected with the third word line WL2, there may be made the 2-step program operation during which lower 2-bit data and upper 1-bit data are stored in memory cells connected with the second word line WL1 where the lower 2-bit data is programmed. This is marked by ⑤ in FIG. 1.

Following the 2-step program operation for memory cells connected with the second word line WL1, a fine program operation (third program operation step) may be made with respect to the first word line WL0. This is marked by ⑥ in FIG. 1. Afterwards, the 1-step, coarse, and fine program operations may be performed sequentially according to the above-described program order (refer to FIG. 1). A manner in which word lines are selected according to the program order described in FIG. 1 may be called an address scramble manner.

In an exemplary embodiment, an address scramble manner is described under the assumption that 3-bit data is stored in one memory cell. However, the inventive concept is not limited thereto. For example, a program operation performed when 4-bit data is stored in one memory cell may be similar to that executed when 3-bit data is stored in one memory cell except that two pages of data are stored during a 2-step program operation, and description thereof is thus omitted. In addition, the scramble order of programming the word lines need not follow the pattern described above. Other patterns that also do not follow the sequential order of the word lines can be used.

If the 1-step program operation and the 2-step program operation are completed, threshold voltage distributions (for example, $2^M$ threshold voltage distributions) corresponding to M-bit data (M being 2 or more integer) all may be formed.

Although all threshold voltage distributions are formed upon completion of the 2-step program operation, margins between threshold voltage distributions may be insufficient to distinguish threshold voltage distributions exactly. The fine program operation may be carried out to secure margins sufficient to distinguish threshold voltage distributions exactly. The fine program operation may be made to narrow a width of each threshold voltage distribution. During the fine program operation, verify voltages may be used which are higher by a predetermine voltage than verify voltages of threshold voltage distributions used at the 2-step program operation. It may be possible to reduce the effects of coupling between adjacent memory cells through the above-described program manner, which is also called a reprogram method, or reprogram algorithm.

In an exemplary embodiment, the above-described reprogram method for 3-bit data, that is, the 1-step programming, coarse programming, and fine programming may be applied to a reprogram method of other data sizes, such as, for example, 2-bit data and 4-bit data.

With the reprogram method, it may be necessary to retain data stored in memory cells in an arbitrary word line until there is completed the fine program operation for the arbitrary word line. For example, the 1-step program operation may be carried out depending upon data provided to a multi-bit memory device from a memory controller, and the 2-step program operation may be made depending upon data stored through the 1-step program operation and data provided from the memory controller. The fine program operation may be made depending upon data stored through the 1-step and 2-step program operations. But, as described above, it may be difficult to exactly read data stored through the 1-step and 2-step program operations. This may mean that data necessary for the fine program operation should be provided to the multi-bit memory device from the memory controller. For this reason, the memory controller may necessitate retaining data stored in memory cells in an arbitrary word line until there is completed the fine program operation for the arbitrary word line. This may mean that a large buffer memory would need to be provided to the memory controller in order to retain data needed for the fine program operation.

Figure 2:
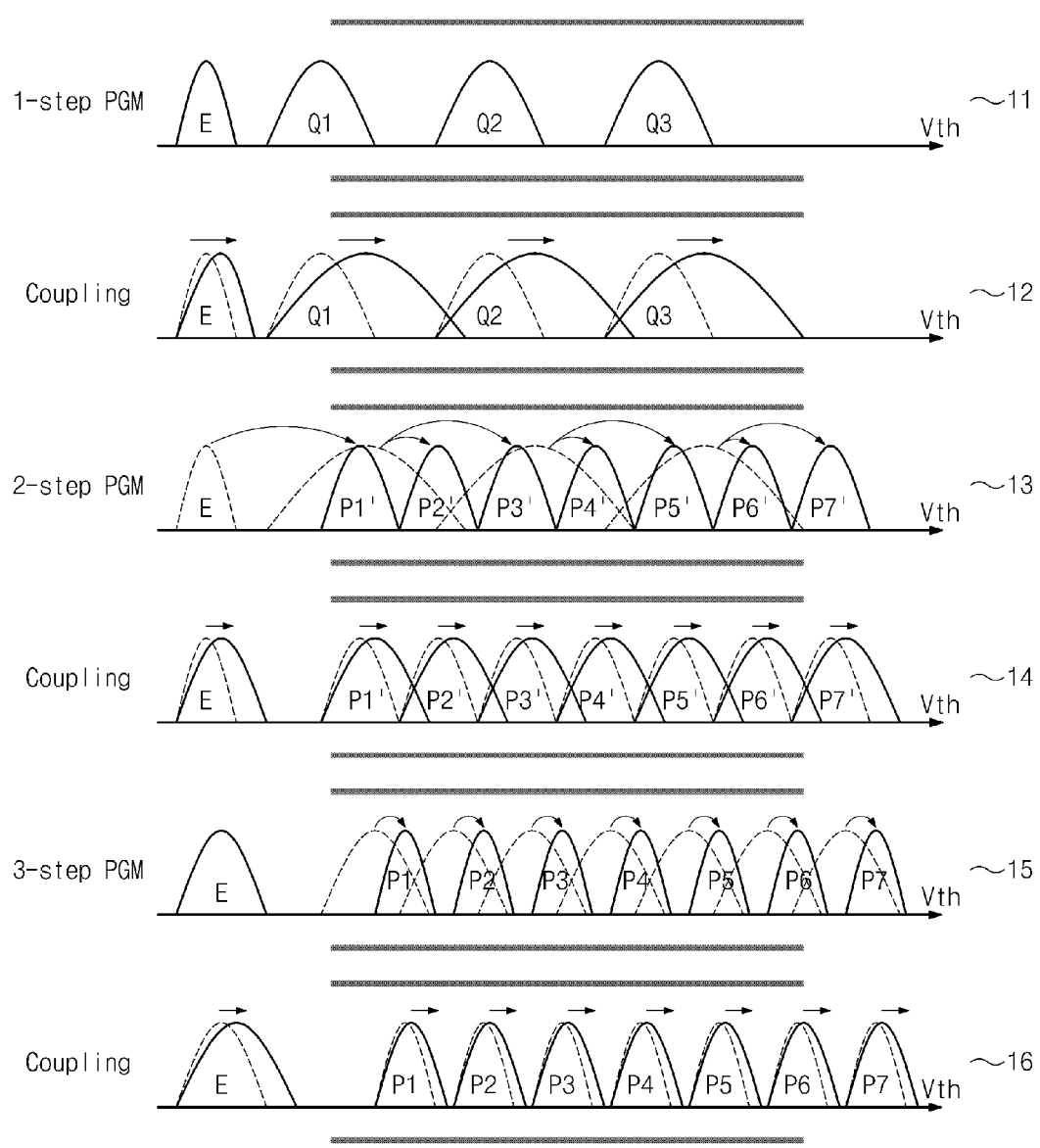
FIG. 2 is a diagram showing threshold voltage distributions varied when a program operation is carried out according to 3-step programming to store 3-bit data in each memory cell.

FIG. 2 is a diagram showing threshold voltage distributions varied when a program operation is carried out according to three-step programming to store 3-bit data in each memory cell.

First, 2-page data (e.g., first and second page data, though other pages may be used) may be stored in memory cells of a selected word line (e.g., WL0 in FIG. 1). At this time, as illustrated in a box 11 of FIG. 2, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (e.g., WL0) may be executed after a 1-step program operation of memory cells in an adjacent word line (e.g., WL1). At this time, as illustrated in a box 12 of FIG. 2, distributions of 1-step programmed memory cells in the word line (for example, WL0) may widen due to the coupling caused when memory cells in an adjacent word line (e.g., WL1) are programmed.

Then, 1-page data, that is, third page data may be stored in memory cells of the selected word line WL0. At this time, as illustrated in a box 13 of FIG. 2, memory cells in a threshold voltage distribution corresponding to a previous state may be programmed to have threshold voltages in corresponding threshold voltage distributions. For example, memory cells in a threshold voltage distribution corresponding to an erase state E may be programmed to have threshold voltages in corresponding threshold voltage distributions to a program states P1', based on data to be programmed. Memory cells in a threshold voltage distribution corresponding to a program state Q1 may be programmed to have threshold voltages in corresponding threshold voltage distributions to program states P2' and P3', based on data to be programmed. Memory cells in a threshold voltage distribution corresponding to a program state Q2 may be programmed to have threshold voltages in corresponding threshold voltage distributions to program states P4' and P5', based on data to be programmed. Memory cells in a threshold voltage distribution corresponding to a program state Q3 may be programmed to have threshold voltages in corresponding threshold voltage distributions to program states P6' and P7', based on data to be programmed.

As described above, a fine program operation of coarse programmed memory cells in a word line (e.g., WL0) may be performed after a 1-step program operation and a coarse program operation on adjacent word lines (e.g., WL1 and WL2). At this time, as illustrated by a box 14 of FIG. 2, distributions of coarse programmed memory cells in the word line (e.g., WL0) may widen due to the coupling caused when memory cells in adjacent word lines (e.g., WL2 and WL1) are programmed. For this reason, it may be difficult to exactly read data from coarse programmed memory cells when performing fine programming.

Memory cells in the word line WL0 may be programmed to have final threshold voltage distributions P1 to P7 as illustrated in a box 15 of FIG. 2. This operation may be called a fine program operation. As described above, the fine program operation may need to use previously programmed data (for example, the first to third page data). Since it may be difficult to read previously programmed data from memory cells in the word line WL0, the fine program operation may be performed based on data provided from a memory controller (or, data separately maintained by a memory device).

As illustrated in a box 16 of FIG. 2, distributions of 3-step programmed memory cells may widen due to the coupling caused when memory cells in adjacent word lines are programmed. Afterwards, a 1-step program operation, a coarse program operation, and a fine program operation on each word line may be made according to a program order (or, sequence) such as described, for example, in FIG. 1, which can be executed in the same manner as described in FIG. 2.

Figure 3:
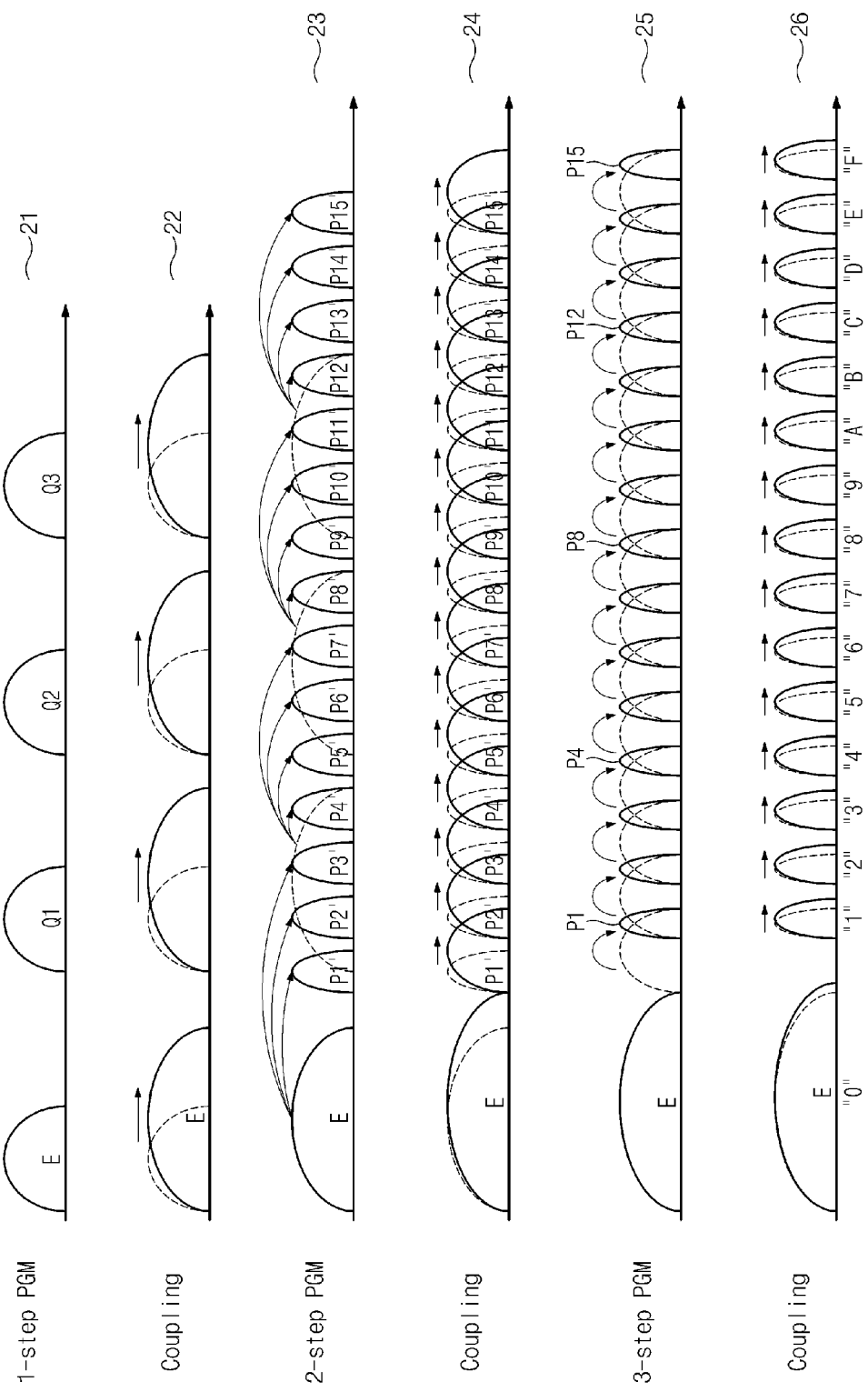
FIG. 3 is a diagram showing threshold voltage distributions varied when a program operation is carried out according to 3-step programming to store 4-bit data in each memory cell.

FIG. 3 is a diagram showing threshold voltage distributions varied when a program operation is carried out according to three-step programming to store 4-bit data in each memory cell.

First, 2-page data (i.e., first and second page data, though other pages may be used) may be stored in memory cells of a selected word line (e.g., WL0 in FIG. 1). At this time, as illustrated in a box 21 of FIG. 3, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (for example, WL0) may be executed after a 1-step program operation of memory cells in an adjacent word line (e.g., WL1). At this time, as illustrated in a box 22 of FIG. 3, distributions of 1-step programmed memory cells in the word line (e.g., WL0) may widen due to the coupling caused when memory cells in an adjacent word line (e.g., WL1) are programmed.

Then, 2-page data, for example, third and fourth page data, may be stored in memory cells of the selected word line WL0. At this time, as illustrated in a box 23 of FIG. 3, memory cells in a threshold voltage distribution corresponding to a previous state may be programmed to have threshold voltages in corresponding threshold voltage distributions. For example, memory cells in a threshold voltage distribution corresponding to an erase state E may be programmed to have threshold voltages in corresponding threshold voltage distributions to program states P1' to P3', based on data to be programmed. Memory cells in a threshold voltage distribution corresponding to a program state Q1 may be programmed to have threshold voltages in corresponding threshold voltage distributions to program states P4' to P7', based on data to be programmed. Memory cells in a threshold voltage distribution corresponding to a program state Q2 may be programmed to have threshold voltages in corresponding threshold voltage distributions to program states P8' to P11', based on data to be programmed. Memory cells in a threshold voltage distribution corresponding to a program state Q3 may be programmed to have threshold voltages in corresponding threshold voltage distributions to program states P12' to P15', based on data to be programmed.

As described above, a third step (i.e., fine) program operation of coarse programmed memory cells in a word line (e.g., WL0) may be executed after a 1-step program operation and a coarse program operation on adjacent word lines (for example, WL2 and WL1). At this time, as illustrated by a box 24 of FIG. 3, distributions of coarse programmed memory cells in the word line (e.g., WL0) may widen due to the coupling caused when memory cells in adjacent word lines (e.g., WL1 and WL2) are programmed. For this reason, it may be difficult to exactly read data from coarse programmed memory cells when performing fine programming.

Memory cells in the word line WL0 may be programmed to have final threshold voltage distributions P1 to P15 as illustrated in a box 25 of FIG. 3. This operation may be called a fine program operation. As described above, the fine program operation may need to use previously programmed data (e.g., the first to fourth page data). Since it may be difficult to read previously programmed data from memory cells in the word line WL0, the fine program operation may be performed based on data provided from a memory controller (or, data separately maintained by a memory device).

As illustrated in a box 26 of FIG. 3, distributions of fine programmed memory cells may widen due to the coupling caused when memory cells in adjacent word lines are programmed. Afterwards, a 1-step program operation, a coarse program operation, and a fine program operation on each word line will be made according to a program order (or, sequence) such as described, for example, in FIG. 1, which can be executed in the same manner as described in FIG. 3.

Figure 4:
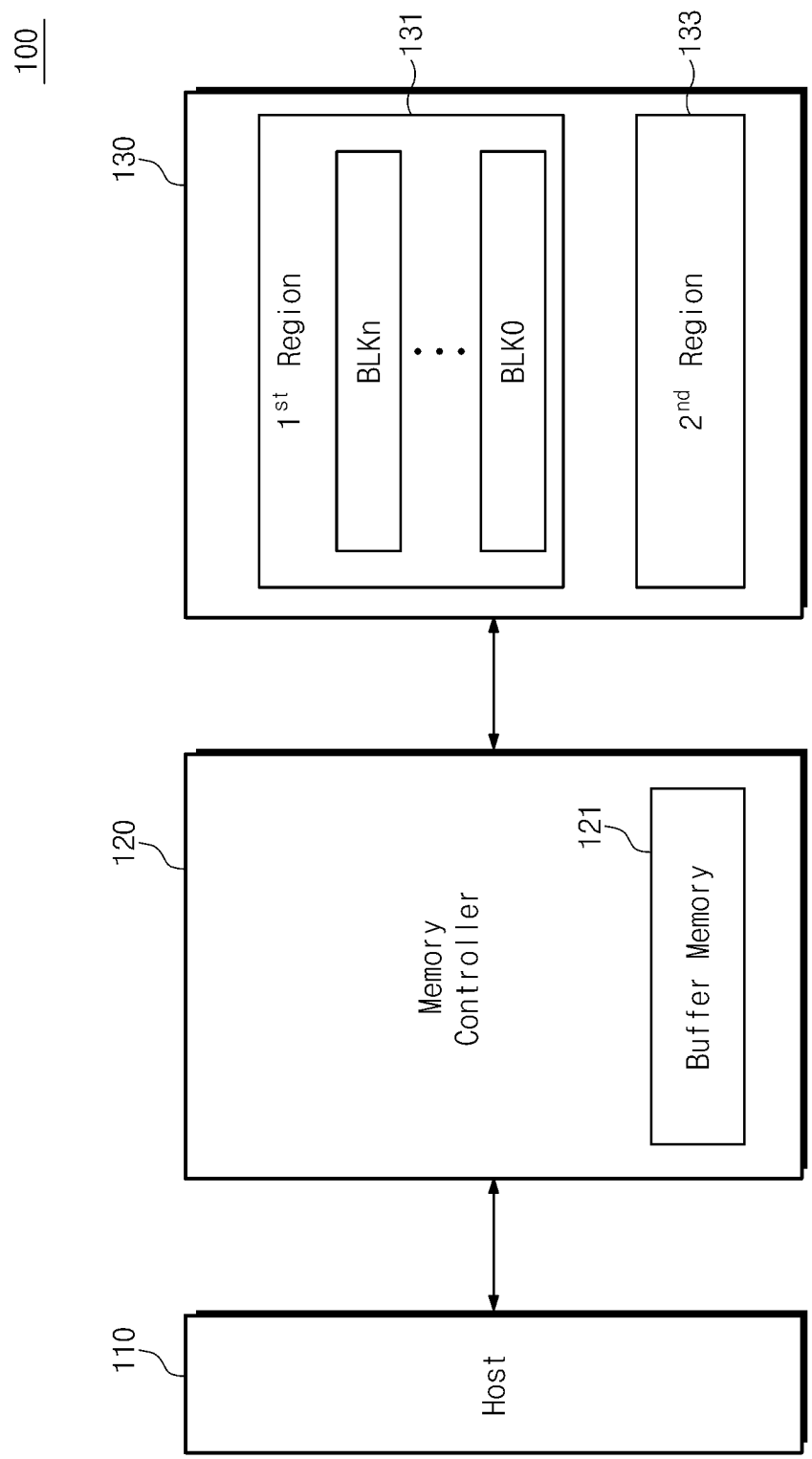
FIG. 4 is a block diagram showing a data storage system according to an exemplary embodiment.

FIG. 4 is a block diagram showing a data storage system according to an exemplary embodiment. Referring to FIG. 4, a data storage system 100 may include a host 110, a memory controller 120, and a multi-bit memory device 130 as a non-volatile memory device.

The multi-bit memory device 130 may be formed of one or more memory chips. As a data storage device, the multi-bit memory device 130 and the memory controller 120 may constitute a memory card, a Solid State Drive (SSD), a memory stick, or the like. The multi-bit memory device may include a plurality of memory blocks (or sectors/banks), each of which has memory cells arranged in rows and columns. Each of the memory cells may store multi-bit (or, multi-level) data. The memory cells are arranged to have the 2-dimensional array structure or the 3-dimensional/vertical array structure. An exemplary 3-dimensional array structure is disclosed in U.S. Pat. Nos. 7,812,390 and 7,646,664, and U.S. Patent Publication Nos. 2008/0023747 and 2008/0084729, the entirety of which are incorporated by reference herein.

Memory blocks of the multi-bit memory device 130 may be divided into a plurality of regions, such as a first region 131 and a second region 133. Herein, it is well understood that division of the first and second regions 131 and 133 is made logically, not necessarily physically. Division of the first and second regions 131 and 133 can be changed logically. In the event that the multi-bit memory device 100 is formed of a plurality of chips or a plurality of physical regions on one or more chips, two regions can be divided physically. The first region 131 may be a hidden area which a user does not access, and the second region 133 may be a user area which a user accesses.

Memory blocks in the first region 131 may be programmed in a manner different from memory blocks in the second region 133. For example, memory blocks in the first region 131 may be programmed according to a single-bit program manner (hereinafter, referred to as an SLC program manner), and memory blocks in the second region 133 may be programmed according to a multi-bit program manner (hereinafter, referred to as an MLC program manner). In addition, memory blocks in the first region 131 and memory blocks in the second region 133 can be programmed according to the above-described N-step programming manner. Each memory cell in the first region 131 may be designated to store and may store 1-bit data, while each memory cell in the second region 133 may be designated to store and may store M-bit data (M being an integer of 3 or more). Further, each memory cell in the first region 131 may store less data bits in number as compared with M-bit data (M being an integer of 3 or more) stored in each memory cell in the second region 133.

The number of blocks included in the first region 131 may be changed according to the number of data bits stored in memory cells of the second region 133. For example, if memory cells in the second region 133 store N-bit data (N being an integer of 3 or more), the first region 131 may include at least N memory blocks. As described further below, each bit of the N-bit data to be stored in memory cells of the second region 133 may be stored in corresponding memory blocks of the first region 131, respectively. For the purposes of the discussion below, each block of a group of blocks in the first region 131 that correspond to a single block in the second region 133 may be referred to as "sub-blocks." For example, a first block in the second region 133 may correspond to a first group of blocks in the first region 131 that includes three sub-blocks.

For the purposes of this discussion, it may be assumed that each memory cell of the second region 133 stores 3-bit data. In this case, the first region 131 may include three sub-blocks corresponding to each memory block of the first region 133. As an example, LSB data bits (i.e., first data bits) of data to be stored in memory cells of a first memory block of the second region 133 may be stored in a first sub-block of the first region 131. Intermediate data bits (i.e., second data bits) of data to be stored in memory cells of the first memory block of the second region 133 may be stored in a second sub-block of the first region 131. MSB data bits (i.e., third data bits) of data to be stored in memory cells of the first memory block of the second region 133 may be stored in a third sub-block of the first region 131. This will be more fully described later.

Continuing to refer to FIG. 4, the memory controller 120 may be configured to control the multi-bit memory device 130 in response to a request of the host 110. The memory controller 120 may include a buffer memory 121. The buffer memory 121 may be used to temporarily store data sent from the host 110 and data read out from the multi-bit memory device 130.

The memory controller 120 may control a program operation of the memory device 130 in the static scheduling manner. For example, when data of the minimum program unit (e.g., page data) for the first region 131 is stored in the buffer memory 121, the memory controller 120 may control the multi-bit memory device 130 such that data of the minimum program unit is stored (or, programmed) in the first region 131. This may be called a buffer program operation, or in some instances herein, a first program operation. The buffer program operation may be performed according to address information associated with data stored in the buffer memory 121. If data of the minimum program unit for the second region 133 is stored in the first region 131, the memory controller 120 may control the multi-bit memory device 130 such that data of the minimum program unit for the second region 133 is stored (or, programmed) in the second region 133. This may be called a main program operation, or in some instances herein, a second program operation. The main program operation may be executed according to address information associated with data stored in the first region 131. The buffer program operation and the main program operation will be more fully described below.

In an exemplary embodiment, the minimum program unit for the first region 131 and the minimum program unit for the second region 133 may be determined variously depending upon a program manner, a cell-per-bit number, and the like. The minimum program unit for the first region 131 may be different from the minimum program unit for the second region 133.

In an exemplary embodiment, it may be possible to minimize a size of the buffer memory 121 of the memory controller 120 by storing data in the first region 131 through the buffer program operation and storing data in the second region 133 through the main program operation. For example, it may be unnecessary to retain data for a three-step program operation in the buffer memory 121. Accordingly, a size of the buffer memory 121 of the memory controller 120 may be minimized.

Figure 6:
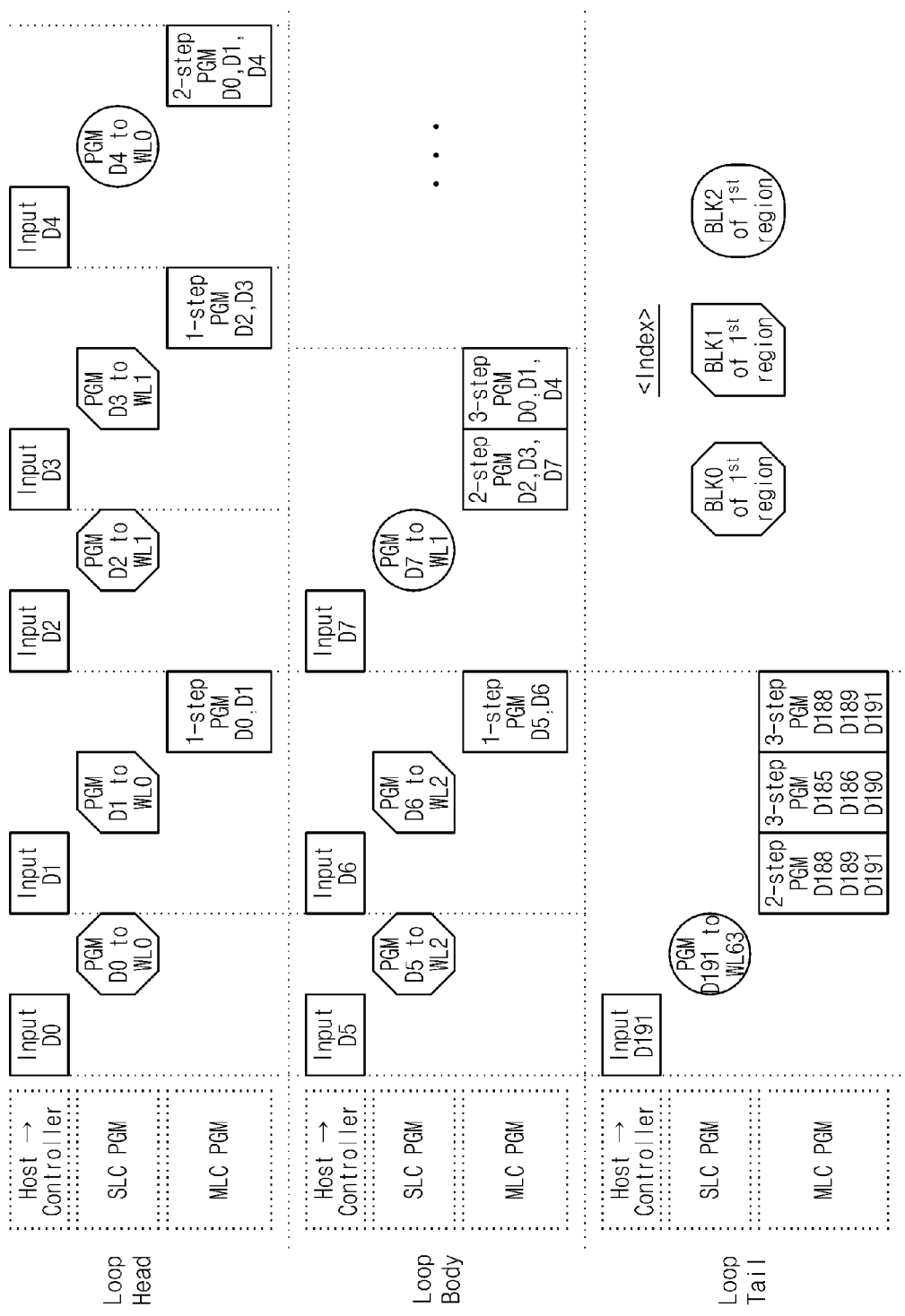
FIG. 6 is a diagram showing data flow during a program operation of a data storage system where an address scramble manner illustrated in FIG. 4 is applied, according to certain exemplary embodiments.

FIG. 5 is a diagram showing an exemplary address scramble manner of a multi-bit memory device which stores 3-bit data per cell and to which a three-step reprogram method is applied, and FIG. 6 is a diagram showing data flow during a program operation of a data storage system where an address scramble manner illustrated in FIG. 5 is applied. Below, a program operation of a data storage system according to another exemplary embodiment will be more fully described with reference to accompanying drawings.

For ease of description, as illustrated in FIG. 5, it is assumed that each of the memory blocks included in a first region 131 and a second region 133 includes 64 word lines WL0 to WL63, that each memory cell in the first region 131 stores 1-bit data, and that each memory cell in the second region 133 stores 3-bit data. With this assumption, 192 pages are stored in each memory block in the second region 133, and those 192 pages may also be stored across three sub-blocks of the first region 131. As described above, since each memory cell of the second region 133 stores 3-bit data, in one embodiment, the first region 131 may include three memory blocks (e.g., sub-blocks) corresponding to each memory block of the second region 133. A first block BLK0 of the first region 131 may be used to store LSB page data of 3-bit data to be stored at a first block of the second region 133, a second block BLK1 of the first region 131 may be used to store intermediate page data of the 3-bit data to be stored at the first block of the second region 133, and a third block BLK2 of the first region 131 may be used to store MSB page data of the 3-bit data to be stored at a first block of the second region 133. Based on an exemplary structure where each block includes K word lines, N×K word lines may be used in the first region 131 to represent the same number of pages (e.g., N pages) of data as K word lines in the second region 133. In one embodiment, each of the K word lines in the second region 133 may store N bits of data.

As described in FIGS. 4 and 5, directly after page data Di (i being 0 to 191) for the first region 131 is stored in a buffer memory 121 of a memory controller 120, data Di stored in the buffer memory 121 may be programmed in the first region 131 of a multi-bit memory device 130 through an SLC program operation. As described above, the page data Di may be stored in the first region 131 via the SLC program operation.

In one embodiment, at a buffer program operation, a memory block (e.g., sub-block) of the first region 131, in which page data Di is to be stored, may be determined according to an order of page data Di as it relates to multi-level data. For example, page data Di corresponding to an LSB bit of the multi-level data may be stored in a block BLK0 of the first region 131. Page data Di corresponding to an intermediate bit of the multi-level data may be stored in a block BLK1 of the first region 131. Page data Di corresponding to an MSB bit of the multi-level data may be stored in a block BLK2 of the first region 131. Further, at the buffer program operation, a word line in which page data Di is to be stored may be determined according to a word line of the second region 133 in which page data Di is stored via a main program operation. For example, at the buffer program operation, page data Di may be stored in a word line of the first region 131 which is identical in relative location to a word line of the second region 133 (e.g., both regions may include same-sized blocks, and the page data Di may be stored in the same word line for each block). For example, the two word lines may both have the same row address, or word line address. This buffer program operation according to an exemplary embodiment may be referred to as a parallel buffer program operation.

The memory controller 200 may judge whether page data for the second region 133 is gathered at the first region 131. A main program operation for the second region 133, for example, a 1-step program operation, a coarse program operation, or a fine program operation may be carried out according to the judgment result. In certain embodiments, 1-step program operation, a coarse program operation, or a fine program operation for the second region 102 may be determined according to an address scramble order such as illustrated in FIG. 5.

Referring to FIGS. 5 and 6, if page data D0 for the first region 131 is transferred to a buffer memory 121 of a memory controller 120 from a host 110, it may be programmed in the first region 131 according to the control of the memory controller 120. The page data D0 may be page data to be stored in a word line WL0 (refer to FIG. 5), and may be formed of an LSB bit of multi-level data. For this reason, the page data D0 may be programmed at the word line WL0 of a first block BLK0 of the first region 131.

The memory controller 120 may judge whether page data for the second region 133 is gathered at the first region 131 and control a main program operation according to the judgment result. Since one page of data D0 is stored in the first region 131, no main program operation may be carried out.

When page data D1 for the first region 131 is transferred to the buffer memory 121 of the memory controller 120 from the host 110, it may be programmed in the first region 131 according to the control of the memory controller 120. The page data D1 may be page data to be stored in a word line WL0 (refer to FIG. 5), and may be formed of an intermediate bit of multi-level data. For this reason, the page data D1 may be programmed at a word line WL0 of a second block BLK1 of the first region 131.

Since page data (e.g., two pages of data for a 1-step program operation) for the second region 133 is gathered at the first region 131, the memory controller 120 may control the multi-level memory device 130 such that page data D0 and D1 stored in the first region 131 are programmed in the second region 133. As such, a 1-step program operation for the word line WL0 may be carried out depending upon two pages of data D0 and D1 stored in the first region 131.

Next, page data D2 may be programmed at a word line WL1 of the first block BLK0 of the first region 131, and page data D3 may be programmed at a word line WL1 of the second block BLK1 of the first region 131. Since page data (e.g., two pages of data for a 1-step program operation) for the second region 133 is gathered at the first region 131, the memory controller 120 may control the multi-level memory device 130 such that page data D2 and D3 stored in the first region 131 are programmed in the second region 133. That is, a 1-step program operation for the word line WL1 may be carried out depending upon two pages of data D2 and D3 stored in the first region 131.

When page data D4 for the first region 131 is transferred to the buffer memory 121 of the memory controller 120 from the host 110, it may be programmed in the first region 131 according to the control of the memory controller 120. The page data D4 may be data to be stored in a word line WL0 (refer to FIG. 5), and may be formed of an MSB bit of the multi-level. For this reason, the page data D4 may be programmed at a word line WL0 of a third block BLK2 of the first region 131.

Since page data (e.g., three pages of data for a coarse program operation) for the second region 133 is gathered at the first region 131, the memory controller 120 may control the multi-level memory device 130 such that page data D0, D1, and D4 stored in the first region 131 are programmed in the second region 133. A coarse program operation for the word line WL0 may be carried out depending upon three pages of data D0, D1, and D4 stored in the first region 131.

Next, page data D5 may be programmed at a word line WL2 of the first block BLK0 of the first region 131, and page data D6 may be programmed at a word line WL2 of the second block BLK1 of the first region 131. Since page data (e.g., two pages of data for a 1-step program operation) for the second region 133 is gathered at the first region 131, the memory controller 120 may control the multi-level memory device 130 such that page data D5 and D6 stored in the first region 131 are programmed in the second region 133. As such, a 1-step program operation for the word line WL2 may be carried out depending upon two pages of data D5 and D6 stored in the first region 131.

Page data D7 may be programmed at a word line WL1 of a third block BLK2 of the first region 131. Since page data (e.g., three pages of data for a coarse program operation) for the second region 133 is gathered at the first region 131, the memory controller 120 may control the multi-level memory device 130 such that page data D2, D3, and D7 stored in the first region 131 are programmed in the second region 133. As such, a coarse program operation for the word line WL1 may be carried out depending upon three pages of data D2, D3, and D7 stored in the first region 131.

After a coarse program operation for the word line WL1 is carried out, a fine program operation may be executed depending upon data D0, D1, and D4 stored in the first region 131. Afterwards, the 1-step, coarse, and fine program operations for remaining page data D8 to D190 may be performed in the same manner as described above, until page data D191 is stored at the first region 131.

Page data D191 may be programmed at a word line WL63 of the third block BLK2 of the first region 131. Since page data (e.g., three pages of data for a 2-step program operation) for the second region 133 is gathered at the first region 131, the memory controller 120 may control the multi-level memory device 130 such that page data D188, D189, and D191 stored in the first region 131 are programmed in the second region 133. That is, a 2-step program operation for the word line WL63 may be carried out depending upon three pages of data D188, D189, and D191 stored in the first region 131.

After a coarse program operation for the word line WL63 is carried out, a fine program operation for a word line WL62 may be executed depending upon data D185, D186, and D190 stored in the first region 131. Finally, a fine program operation for the word line WL63 may be executed depending upon data D188, D189, and D191 stored in the first region 131.

As a result of this process, in one embodiment, a memory block of an MLC region of a memory device can be programmed using a plurality of memory blocks in a SLC region of the memory device, wherein the number of memory blocks in the SLC region used for programming the block in the MLC region is equal to the number of bits per cell of the memory cells in the MLC region. This can provide direct mapping between word lines of the blocks in the SLC region and word lines of the block in the MLC region, which can improve programming speed.

Figure 7:
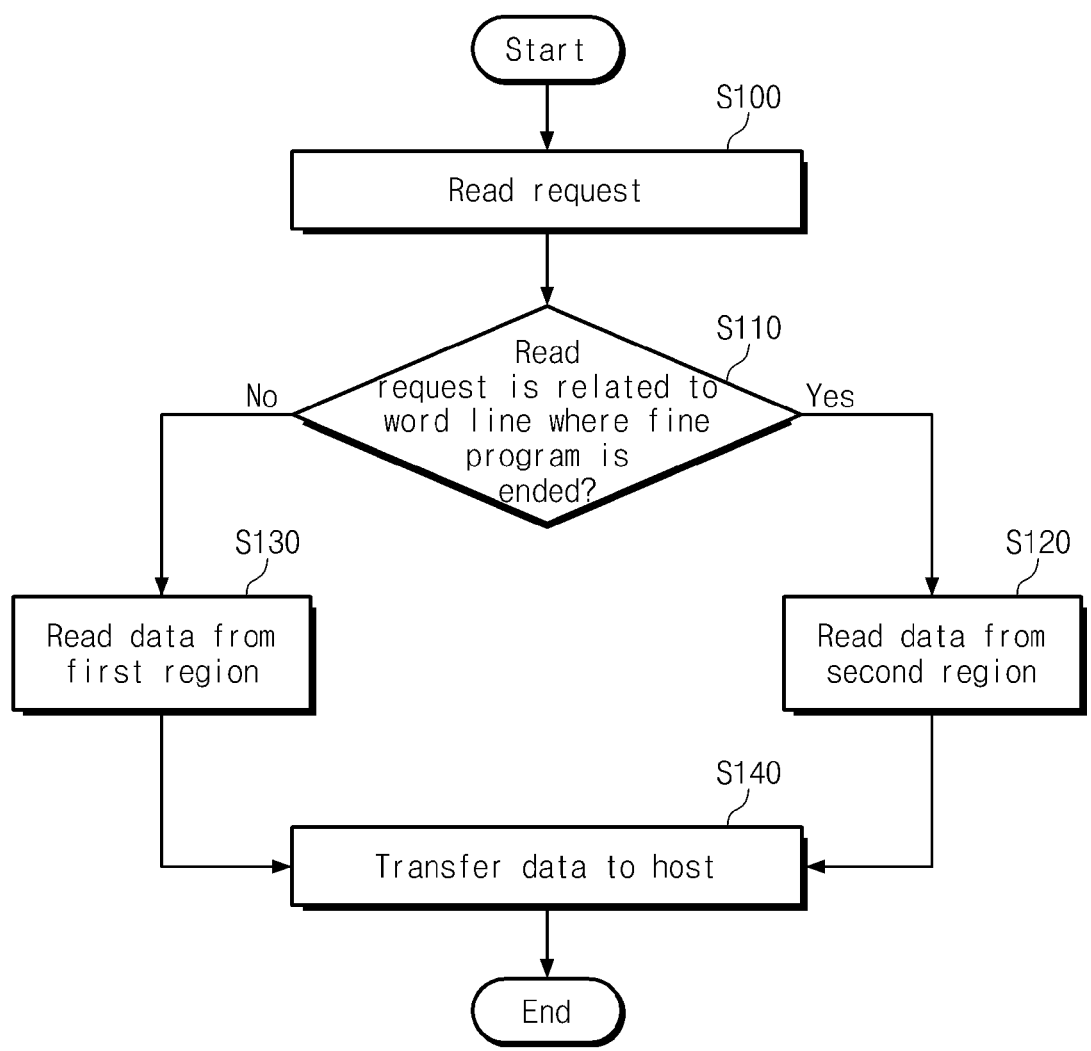
FIG. 7 is a flow chart for describing a read operation of a memory system illustrated in FIG. 4, according to certain exemplary embodiments.

FIG. 7 is a flow chart for describing a read operation of a memory system illustrated in FIG. 4, according to one exemplary embodiment.

In step S100, a read operation may be requested from an external device (e.g., a host). In step S110, a memory controller 120 may judge whether the read request is related to a word line whose three-step program operation is completed. Whether the three-step program operation for each word line is completed may be judged depending upon address mapping information.

In the event that the read request is associated with a word line whose three-step program operation is completed, in step S120, the memory controller 120 may control a multi-bit memory device 130 such that requested data is read from a second region 133 of the memory device 100. The read operation for the second region 133 may be an MLC read operation. Data read from the second region 133 may be temporarily stored in a buffer memory 121 of the memory controller 120. Afterwards, the procedure goes to step S140.

Returning to step S110, if the read request is associated with a word line whose three-step program operation is not completed (e.g., fine programming has not been completed), in step S130, the memory controller 120 controls the multi-bit memory device 130 such that requested data is read from the first region 131. The read operation for the first region 131 may be an SLC read operation. Data read from the first region 131 may be temporarily stored in the buffer memory 121 of the memory controller 120. Afterwards, the procedure goes to step S140, in which data stored in the buffer memory 121 is sent to the external device, that is, the host 110. As a result, pages of data that have been written to the memory device 100 but that have not yet been stored in the MLC region can still be properly read from the device.

Figure 8:
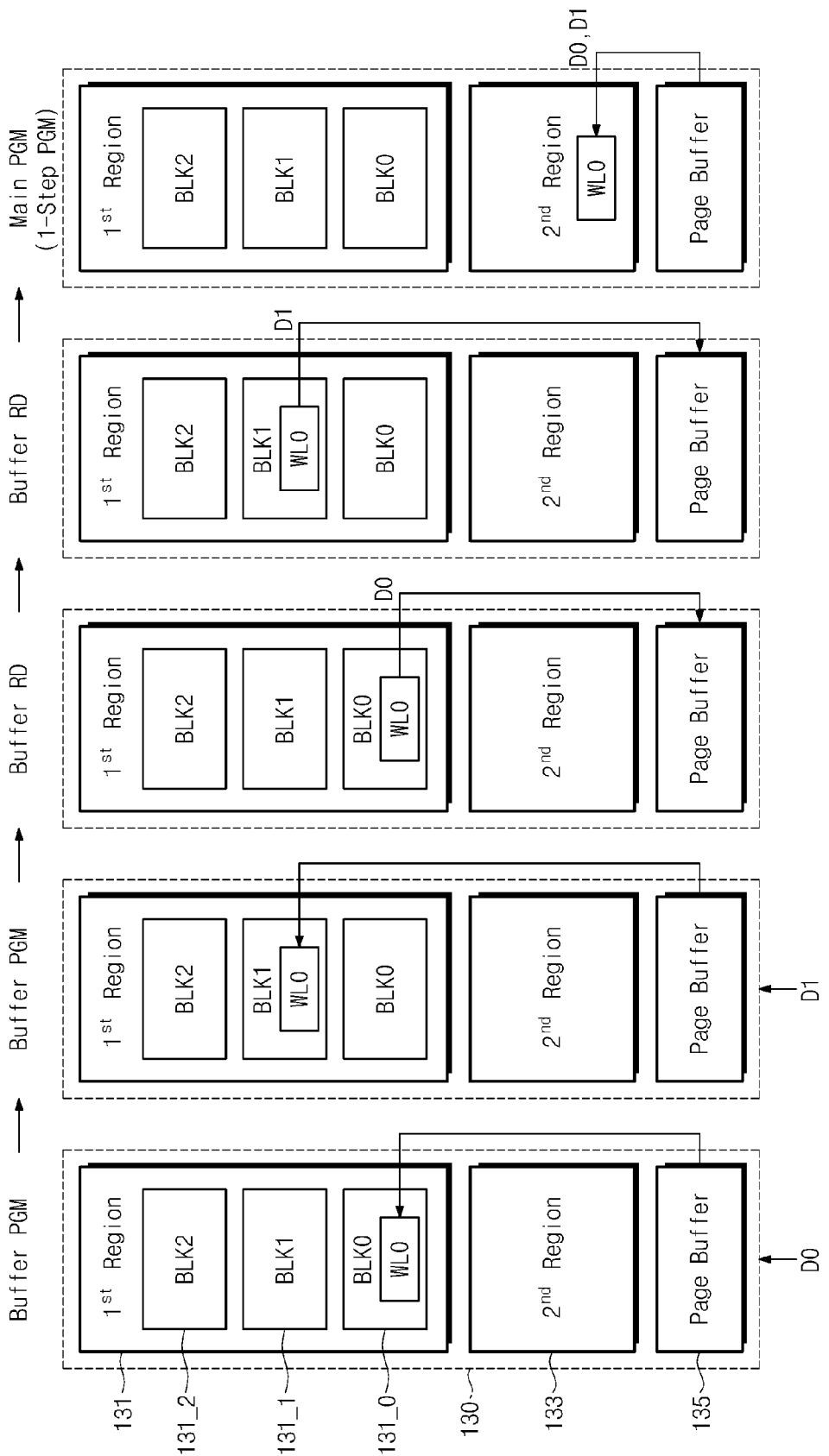
FIGS. 8 and 9 are diagrams illustrating data flow according to a set of a parallel buffer program operation and a main program operation described in FIG. 6, according to certain exemplary embodiments.
Figure 9:
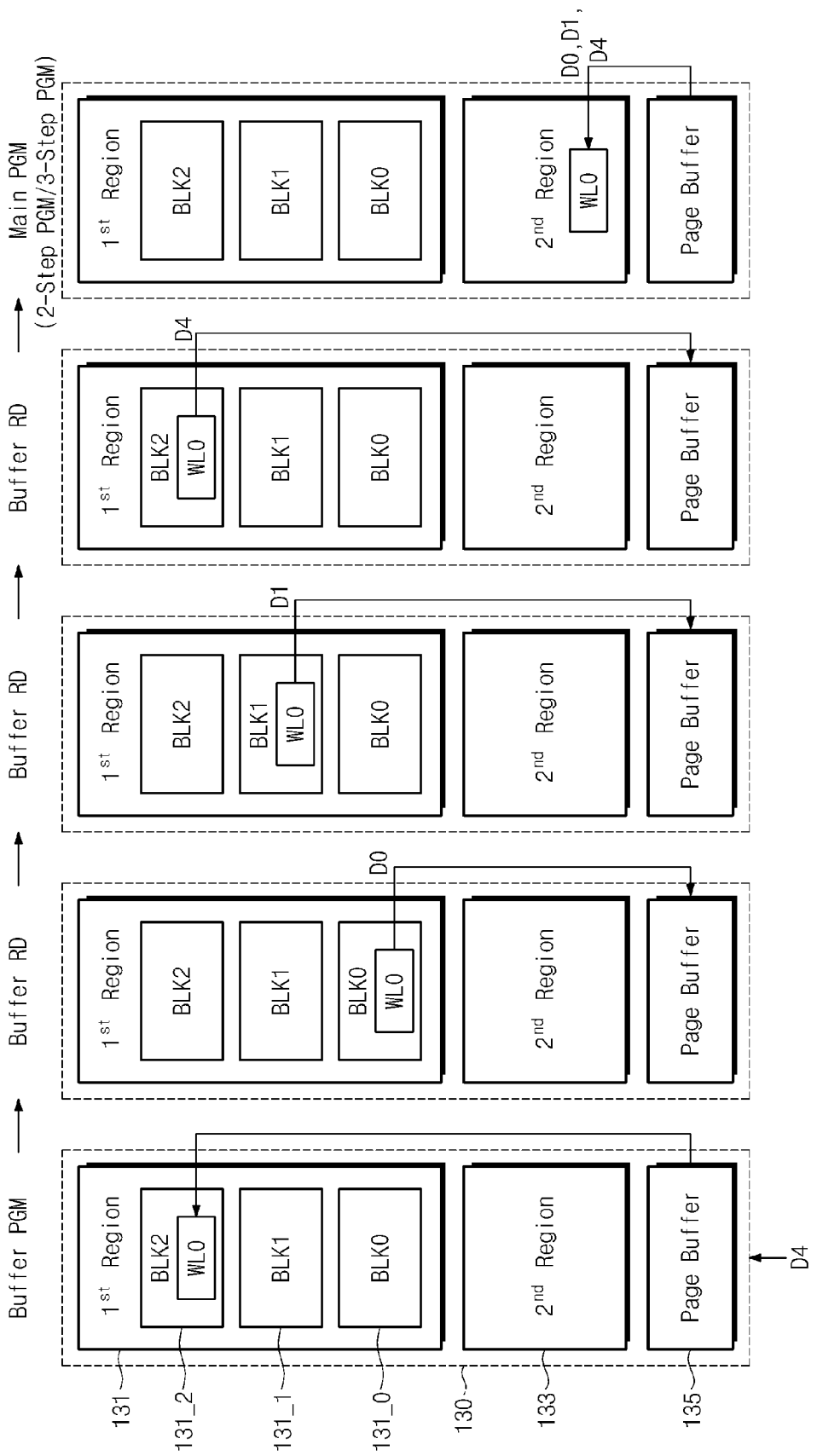

FIGS. 8 and 9 are diagrams illustrating exemplary data flow according to a set of a parallel buffer program operations and a main program operation described in FIG. 6. FIGS. 10 and 11 are diagrams illustrating a bias condition at a parallel buffer program operation according to an exemplary embodiment.

Referring to FIG. 8, page data D0 may be loaded onto a page buffer 135 of a multi-level memory device 130. The loaded page data D0 of the page buffer 135 may be stored in a word line WL0 of a first block 131_0 of a first region 131. Page data D1 may be loaded onto the page buffer 135 of the multi-level memory device 130. The loaded page data D1 of the page buffer 135 may be stored in a word line WL0 of a second block 131_1 of the first region 131.

As described in relation to FIGS. 5 and 6, a word line, in which page data D0 and D1 are to be stored, may be the same as that of a second region 133 in which data D0 and D1 is to be stored via a main program operation (e.g., it may have an identical relative location (physically and/or logically) and/or row address within a same-sized block). For this reason, the page data D0 and D1 may be stored in word lines WL0 of different blocks 131_0 and 131_1 of the first region 131. With this parallel buffer program operation, as illustrated in FIG. 11, the page data D0 and D1 may be stored at the same word line WL0 by changing a block address from BLK0 to BLK1. In other words, it is possible to program two pages of data D0 and D1 by generating a program voltage Vpgm and a pass voltage Vpass once. For example, as shown in FIG. 6, between the steps of programming D0 to WL0 of a first block of the first region 131 and programming D1 to WL0 of a second block of the first region 131, word lines can maintain a program voltage Vpgm and a pass voltage Vpass at a constant level, instead of needing to be changed to a different voltage and then reset to Vpgm and Vpass. For this reason, there may be reduced a setup time and a reset time (e.g., a recovery time) needed to generate the program voltage Vpgm and the pass voltage Vpass, respectively.

Continuing to refer to FIG. 8, if two pages of data D0 and D1 are stored in the first region 131, for example, if page data for the second region 133 (e.g., two pages of data for a 1-step program operation) is gathered at the first region 131, the two pages of data D0 and D1 may be sequentially read by the page buffer 135. This read operation may be referred to as a parallel buffer read operation. With the parallel buffer read operation, as illustrated in FIG. 10, the page data D0 and D1 may be read by changing a block address from BLK0 to BLK1. In other words, it is possible to read two pages of data D0 and D1 by generating a selection read voltage Vrd and a non-selection read voltage Vread once. For this reason, there may be reduced a setup time and a reset time (e.g., a recovery time) needed to generate the selection read voltage Vrd and the non-selection read voltage Vread, respectively.

Returning to FIG. 8, two pages of data D0 and D1 stored in the page buffer 135 may be stored in the second region 133 according to a 1-step program operation of the main program operation.

Referring to FIG. 9, page data D4 may be loaded onto the page buffer 135 of the multi-level memory device 130. The loaded page data D4 of the page buffer 135 may be stored at a word line WL0 of a third block 131_2 of the first region 131. As described in relation to FIGS. 5 and 6, a word line, in which page data D4 is to be stored, may be identical to that of the second region 133 in which data D4 is to be stored via the main program operation. For this reason, the page data D4 may be stored in a word line of a block (i.e., a third block 131_2) different from a block in which the page data D0 and D1 is stored.

If page data for the second region 133 (e.g., three pages of data for a three-step program operation) is gathered at the first region 131, the three pages of data D0, D1, and D4 may be sequentially read by the page buffer 135. With the parallel buffer read operation, as illustrated in FIG. 10, the page data D0, D1, and D4 may be read by changing a block address from BLK0 to BLK2. As a result, it is possible to read three pages of data D0, D1, and D4 by generating the selection read voltage Vrd and the non-selection read voltage Vread once. In the method described above, a plurality of pages (e.g., three pages) are divisionally stored in a plurality of corresponding memory blocks (e.g., at least one page is stored in each memory block). Because the first page data D0, the second page data D1, and later the third page data D4 are stored in the same word line (WL0) with respect to their respective blocks, the process of storing the data D0, D1, and D4 may be referred to herein as a co-locational storage process. Similarly the process of reading the data D0, D1, and D4 from the same relative word line in each block may be referred to herein as a co-locational read process.

Continuing to refer to FIG. 9, three pages of data D0, D1, and D4 temporarily stored in the page buffer 135 may be stored in the second region 133 according to a second-step (i.e., coarse) program operation of the main program operation. A third-step (i.e., fine) program operation may be carried out in the same manner as the second-step program operation. For example, a fine program operation for a word line WL0 of the second region 133 may be performed by sequentially reading three pages of data D0, D1, and D4 via the parallel buffer read operation and programming the three pages of data D0, D1, and D4 stored in the page buffer 135 in the second region 133.

FIGS. 8 and 9 therefore illustrate a method of storing data in a data storage system. The method includes providing a memory cell array. The method further includes providing N blocks in a first region of the memory cell array (e.g., BLK0, BLK1, and BLK2). N may be an integer greater than 1, and each cell of each block of the N blocks may be configured to store no more than N–1 bits of data (e.g., they may be SLC cells that store only 1 bit of data). The method additionally includes providing a block in the second region of the memory cell array. Each cell of the block in the second region may be configured to store N bits of data (e.g., they may be MLC cells that store 3 bits of data). The data storage system is configured (for example, at a manufacturing stage or later) so that when data is programmed to the memory cell array, N pages of the data are initially stored in N respective blocks of the first region of the memory cell array, and then the N pages of the data are stored in the block of the second region.

In one embodiment, each block of the N blocks includes K word lines, and the block in the second region includes K word lines. The data storage may be configured so that when data is programmed to the memory cell array, the N pages of the data are initially stored in Mth word lines (e.g., WL0) of each of the N respective blocks of the first region of the memory cell array, and then the N pages of the data are stored in an Mth word line (e.g., WL0) of the block of the second region. Storing the N pages of the data in the block of the second region may include reading the N pages of the data from the N blocks of the first region, and then programming the data read from the N blocks of the first region to the block of the second region.

Figure 12:
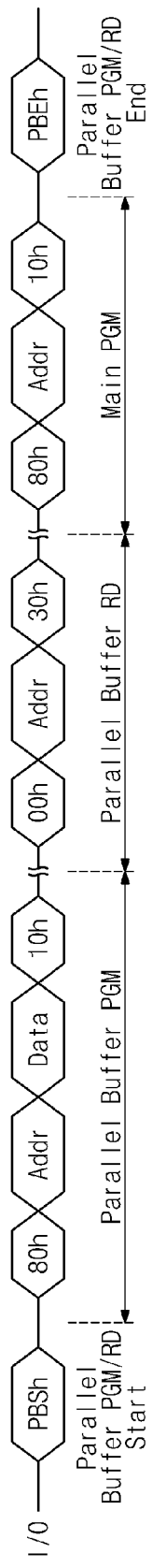
FIG. 12 is a diagram for describing a command provided to a multi-level memory device to perform a program operation that includes a parallel buffer program/read operation according to an exemplary embodiment.

FIG. 12 is a diagram for describing a command provided to a multi-level memory device to perform a program operation that includes a parallel buffer program/read operation according to an exemplary embodiment.

Referring to FIG. 12, there are illustrated commands for controlling a parallel buffer program operation, a parallel buffer read operation, and a main program operation. The commands may be provided to a multi-level memory device 130 (refer to FIG. 4) from a memory controller 120 (refer to FIG. 4).

A parallel buffer program/read start command PBSh for a parallel buffer program/read operation may be provided to the multi-level memory device 130. Once the parallel buffer program/read start command PBSh is provided, the multi-level memory device 130 may perform a parallel buffer program operation although typical program commands 80h and 10h are received. Further, if the parallel buffer program/read start command PBSh is provided, the multi-level memory device 130 may perform a parallel buffer read operation although typical read commands 00h and 30h are received. As such, in the embodiment shown in FIG. 12, a single start command may be received that instructs the memory to treat subsequent commands as related to a parallel program and read sequence (until an end command is received). The start and end commands may each be referred to as a mode-switching command. As discussed previously, a single address can be received in the parallel program and read sequences. The single address can be used to store data to and access data from co-located word lines within different memory blocks. Because the parallel buffer program/read start command (i.e., mode-switching command) has been received, the data received can be appropriately programmed to and read from a plurality of memory blocks using the received address.

After the parallel buffer read operation is carried out, the program commands 80h and 10h may be provided to the multi-level memory device 130. A main program operation may be discriminated from a parallel buffer program operation according to data (or, a page address associated with the data) to be stored in a second region 133. If the main program operation is completed, a parallel buffer program/read command PBEh may be provided to the multi-level memory device 130 to end the parallel buffer program/read operation.

In one embodiment, the parallel buffer read operation and the main program operations (e.g., the 1-step program operation, the coarse program operation, and/or the fine program operation) may be performed automatically within the multi-level memory device 130 without intervention of the memory controller 120. In another embodiment, the parallel buffer read operation and the main program operation (e.g., the 1-step program operation, the coarse program operation, and/or the fine program operation) may be performed according to the control of the memory controller 120.

Figure 13:
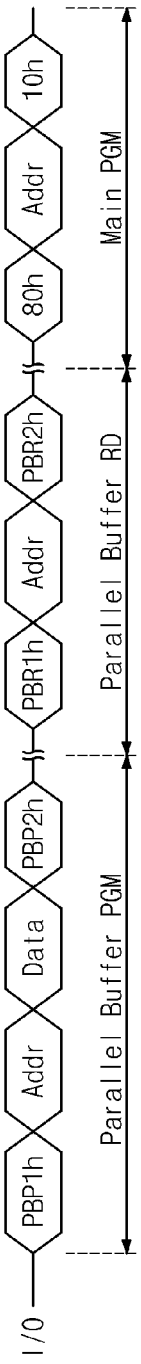
FIG. 13 is a diagram for describing another command provided to a multi-level memory device to perform a program operation that includes a parallel buffer program/read operation according to an exemplary embodiment.

FIG. 13 is a diagram for describing another command provided to a multi-level memory device to perform a program operation that includes a parallel buffer program/read operation according to an exemplary embodiment.

Referring to FIG. 13, there are illustrated commands for controlling a parallel buffer program operation and a parallel buffer read operation. The command may be provided to a multi-level memory device 130 (refer to FIG. 4) from a memory controller 120 (refer to FIG. 4).

Parallel buffer program commands PBP1h and PBP2h for controlling the parallel buffer program operation may be provided to the multi-level memory device 130. In another embodiment, the parallel buffer program command PBP1h and a typical program command (e.g., 10h) may be sequentially provided to the multi-level memory device 130. In still another embodiment, a typical program command (e.g., 80h) and the parallel buffer program command PBP2h may be sequentially provided to the multi-level memory device 130. If the commands are provided, the multi-level memory device 130 may perform a parallel buffer program operation as described above.

Prior to a main program operation, parallel buffer read commands PBR1*h* and PBR2*h* for controlling a parallel buffer read operations may be provided to the multi-level memory device 130. In another embodiment, the parallel buffer read command PBR1*h* and a typical read command (e.g., 30*h*) may be sequentially provided to the multi-level memory device 130. In still another embodiment, a typical read command (e.g., 00*h*) and the parallel buffer read command PBR2*h* may be sequentially provided to the multi-level memory device 130. If the commands are provided, the multi-level memory device 130 may perform a parallel buffer read operation as described above.

In other words, the parallel buffer program operation and the parallel buffer read operation may be performed when corresponding commands are provided to the multi-level memory device 130 from the memory controller 120. The main program operation may be carried out when a typical program command is provided to the multi-level memory device from the memory controller 120. The embodiment of FIG. 13 differs from the embodiment of FIG. 12 in that it includes individual parallel program and parallel read commands at different stages in the overall program operation, instead of using only one overall parallel program/read command that applies to the overall program operation.

FIGS. 14 to 17 are diagrams for describing various combinations on first and second regions of a multi-bit memory device according to exemplary embodiments. In figures, "BP" indicates buffer programming on a first region 131, and "MP" indicates main programming on a second region 133.

In one embodiment, a multi-bit memory device 130 is a semiconductor chip having one or more memory cell arrays. As described above, the multi-bit memory device 130 may include the first region 131 and the second region 133. The first and second regions 131 and 133 may constitute a memory cell array of the multi-bit memory device 130. Although not illustrated in the figures, the memory cell array may include further regions such as a meta region, a reserved region, and the like. It is well understood that regions of the memory cell array are divided logically, not necessarily physically. This means that such regions of the memory cell array may be defined according to address mapping of a memory controller 120.

Figure 14:
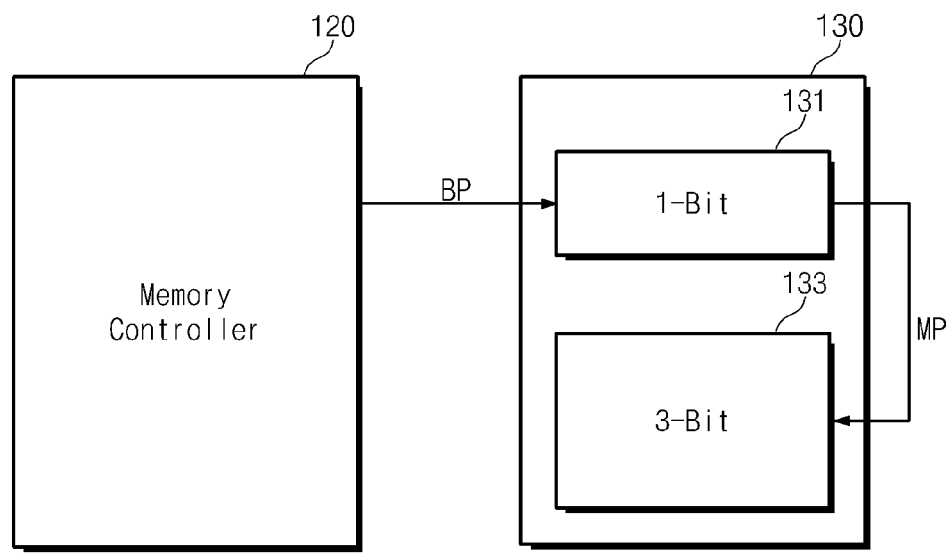
FIGS. 14 to 17 are diagrams for describing various combinations on first and second regions of a multi-bit memory device according to an exemplary embodiment.

Referring to FIG. 14, in case of a multi-bit memory device 130 which stores 3-bit data per cell, the first region 131 is formed of memory cells each storing 1-bit data, and the second region 133 is formed of memory cells each storing 3-bit data. In this case, buffer programming may be executed according to an SLC program manner, and main programming may be made according to the above-described MLC program manner.

Figure 15:
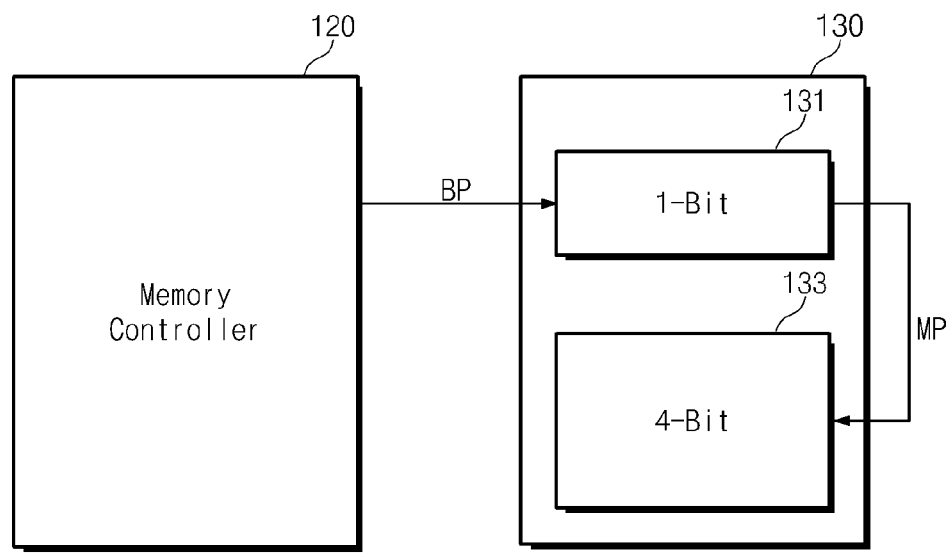

Referring to FIG. 15, in case of a multi-bit memory device 130 which stores 4-bit data per cell, the first region 131 is formed of memory cells each storing 1-bit data, and the second region 133 is formed of memory cells each storing 4-bit data. In this case, buffer programming may be executed according to an SLC program manner, and main programming may be made according to the above-described MLC program manner.

Figure 16:
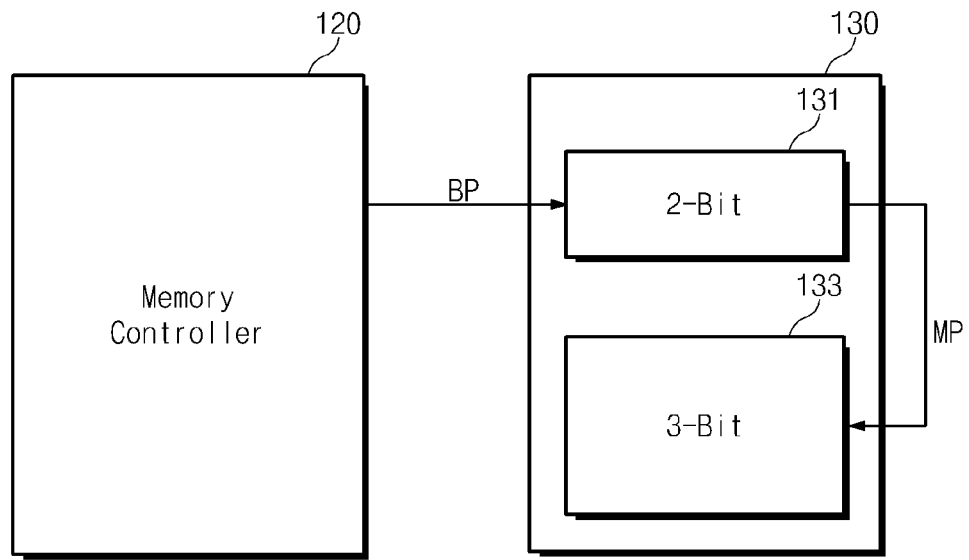

Referring to FIG. 16, in case of a multi-bit memory device 130 which stores 3-bit data per cell, the first region 131 is formed of memory cells each storing 2-bit data, and the second region 133 is formed of memory cells each storing 3-bit data. In this case, buffer programming may be executed according to the above-described or conventional MLC program manner, and main programming may be made according to the above-described MLC program manner (for example, a reprogram manner).

Figure 17:
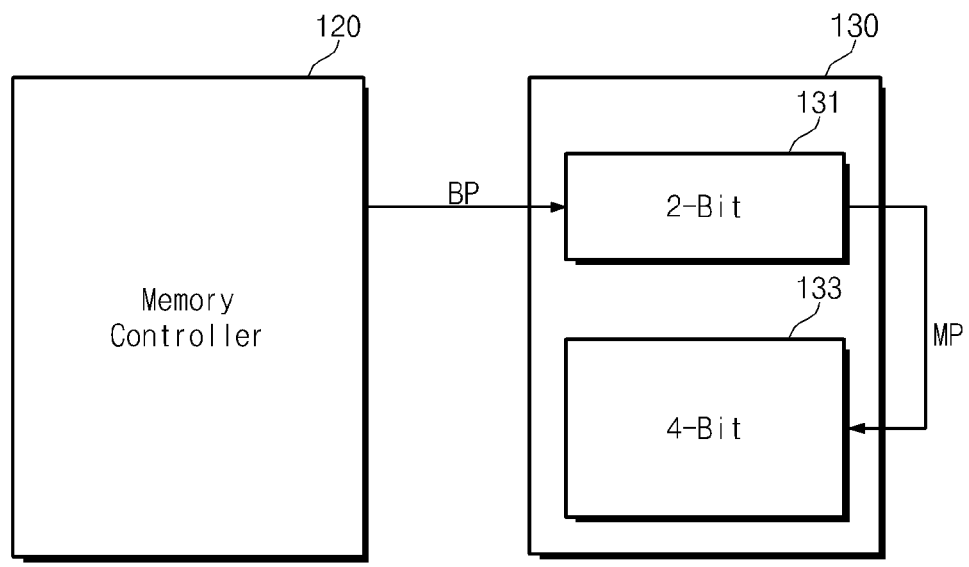

Referring to FIG. 17, in case of a multi-bit memory device 130 which stores 4-bit data per cell, the first region 131 is formed of memory cells each storing 2-bit data, and the second region 133 is formed of memory cells each storing 4-bit data. In this case, buffer programming may be executed according to the above-described or conventional MLC program manner, and main programming may be made according to the above-described MLC program manner (for example, a reprogram manner).

In an exemplary embodiment, it is well understood that defining of the first and second regions 131 and 133 illustrated in FIGS. 14 to 17 is not limited to this disclosure. For example, if a nonvolatile memory device included in a data storage system 100 (refer to FIG. 4) is formed of a plurality of multi-bit memory devices, the first and second regions 131 and 133 can be defined with respect to the respective multi-bit memory devices (e.g., different memory chips or packages). Alternatively, the first region 131 can be defined with respect to any one of the multi-bit memory devices. Still alternatively, any one multi-bit memory device can be defined as the first region 131.

Figure 18:
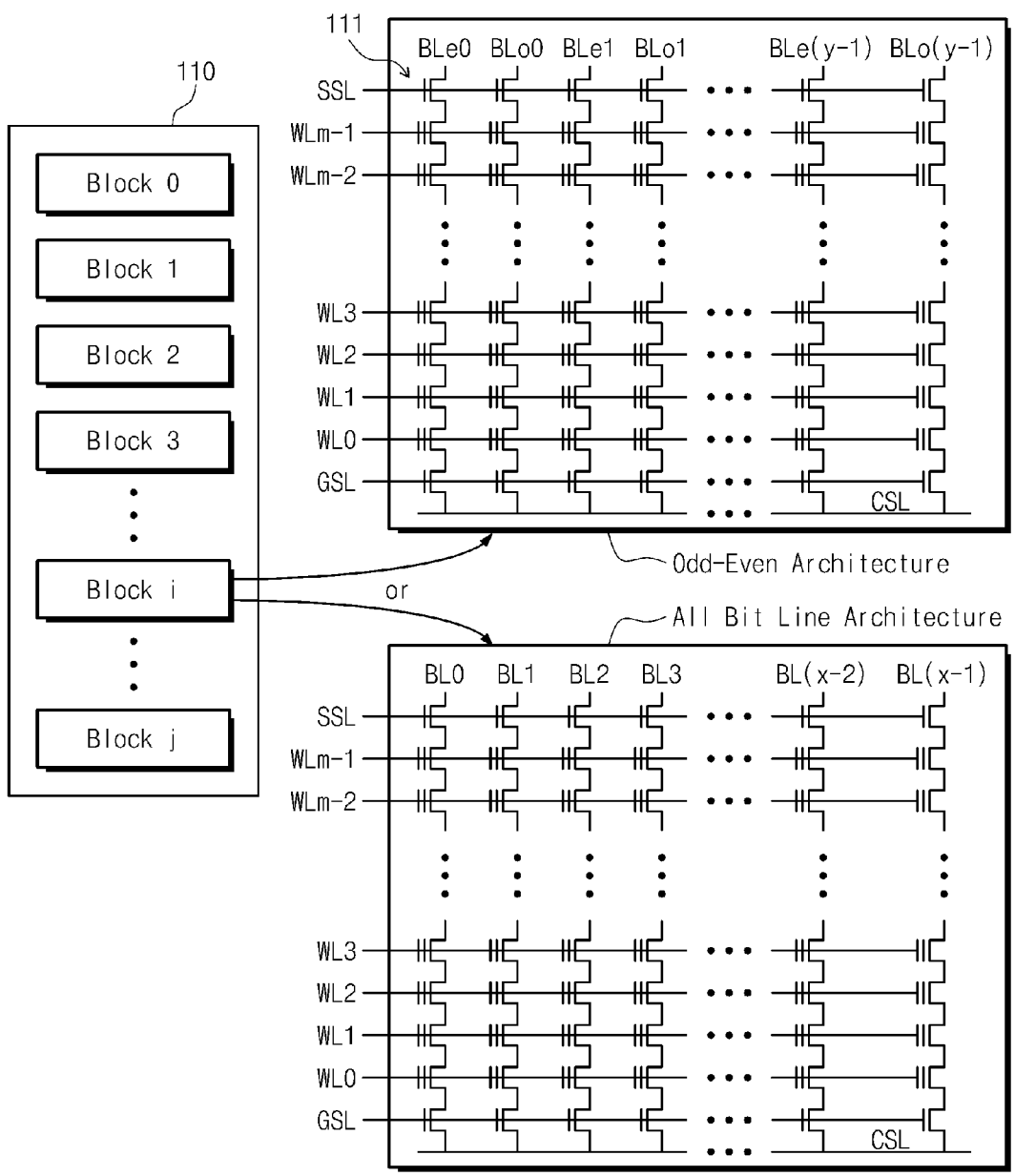
FIG. 18 is a diagram illustrating a memory cell array having the all bit line memory architecture or the odd-even memory architecture according to certain exemplary embodiments.

FIG. 18 is a diagram illustrating a memory cell array having the all bit line memory architecture or the odd-even memory architecture. Exemplary structures of a memory cell array included in a multi-bit memory device 130 illustrated in FIG. 4 will be described. As one example, a NAND flash memory device including a memory cell array 110 partitioned into 1,024 blocks will now be described. The data stored in each block may be simultaneously erased. In one embodiment, the memory block is the minimum unit of storage elements that are simultaneously erased. Each memory block, for example, has columns each corresponding to bit lines (e.g., bit lines of 1 KB). In one embodiment referred to as the all bit line (ABL) architecture, all the bit lines of a memory block are capable of being simultaneously selected during read and program operations. Storage elements in a common word line and connected to all bit lines are capable of being programmed at the same time.

In an exemplary embodiment, a plurality of storage elements in the same column are connected in series to form a NAND string 111. One end of the NAND string 111 is connected to a corresponding bit line via a select transistor which is controlled by a string select line SSL, the other end is connected to a common source line CSL via a select transistor which is controlled by a ground select line GSL.

In another embodiment referred to as the odd-even architecture, bit lines are divided into even bit lines (BLe) and odd bit lines (BLo). In the odd/even bit line architecture, storage elements in a common word line and connected to the odd bit lines are programmed at the first time, while storage elements in the common word line and connected to even bit lines are programmed at the second time. Data is capable of being programmed to and read from different blocks. Such operations are capable of being performed at the same time.

A flash memory device forming a multi-bit memory device 130 may be a nonvolatile memory device which retains data even at power-off. With an increase in mobile devices such as cellular phone, PDA digital camera, portable gate console, and MP3P, a flash memory device is widely used as not only data storage but also code storage. The flash memory device, further, is capable of being used at home applications such as HDTV, DVD, router, and GSP.

Figure 19:
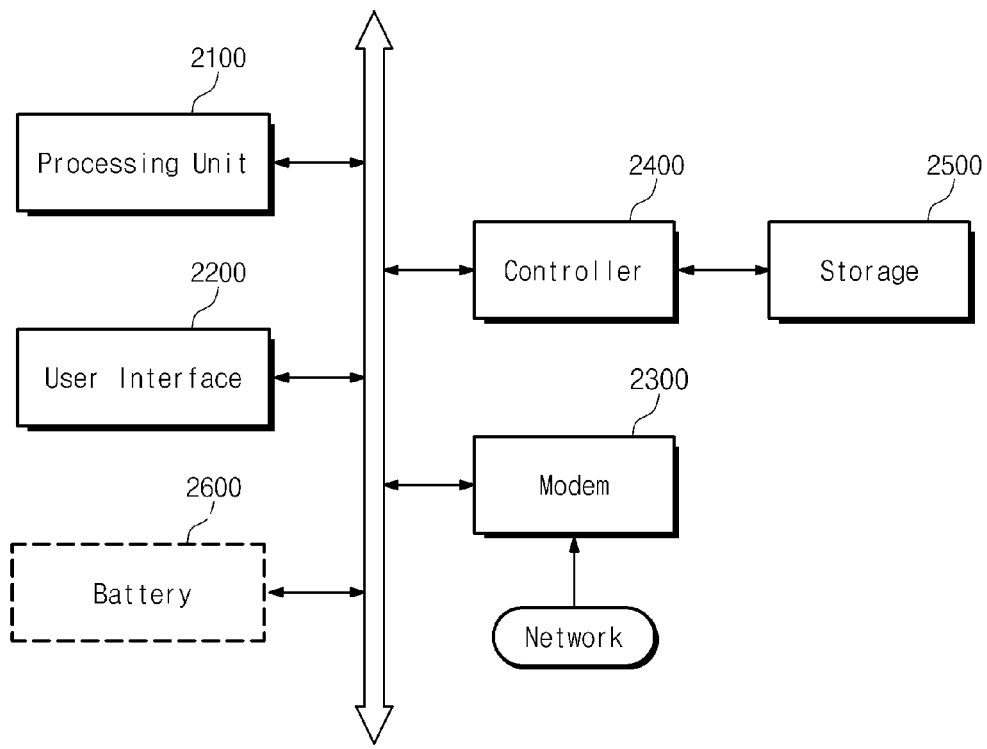
FIG. 19 is a block diagram showing a computing system according to an exemplary embodiment.

FIG. 19 is a block diagram showing a computing system according to an exemplary embodiment.

A computing system may include a processing unit 2100 (e.g., a microprocessor), a user interface 2200, a modem 2300 such as a baseband chipset, a memory controller 2400, and a multi-bit memory device 2500 as a storage media. In one embodiment, the multi-bit memory device 2500 may be configured the same as illustrated in FIG. 4. For example, a size of a buffer memory included in the memory controller 2400 can be minimized. N-bit data (N being 1 or more integer) processed/to be processed by the microprocessor 2100 may be stored in the multi-bit memory device 2500 through the memory controller 2400. In the event that the computing system is a mobile device, a battery 2600 may be further included in the computing system to supply an operating voltage thereto. Although not illustrated in FIG. 19, the computing system may further comprise an application chipset, a camera image processor (CIS), a mobile DRAM, and the like.

Figure 20:
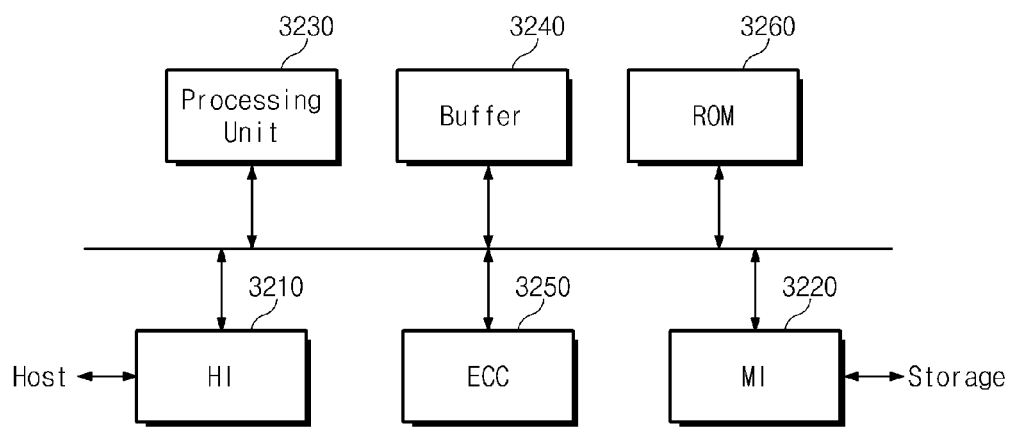
FIG. 20 is a block diagram showing a memory controller according to an exemplary embodiment.

FIG. 20 is a block diagram showing a memory controller according to an exemplary embodiment. Referring to FIG. 20, a controller may be configured to store data in a storage media and read data from the storage media. The controller may include a first interface 3210, a second interface 3220, a processing unit 3230, a buffer memory 3240, an ECC unit 3250, and a ROM 3260. The memory controller in FIG. 20 may be applied to a system such as that illustrated in FIG. 4 or 19.

The first interface 3120 may be configured to interface with an external device (for example, a host), and the second interface 3220 may be configured to interface with the storage media 3100, for example a storage media such as illustrated in FIG. 4 or 19. The processing unit 3230 may be configured to control an overall operation of the controller 3200. The processing unit 3230 may be configured to operate firmware such as Flash Translation Layer (FTL) stored in the ROM 3260. The buffer memory 3240 may be used to temporarily store data to be written in the storage media 3100 or data read out from the storage media 3100. The ECC unit 3250 may be configured to encode data to be stored in the storage media 3100 and to decode data read from the storage media 3100.

In one embodiment, the memory controller may be configured to sequentially generate commands according to a command sequence such as described in FIGS. 12 and 13.

Figure 21:
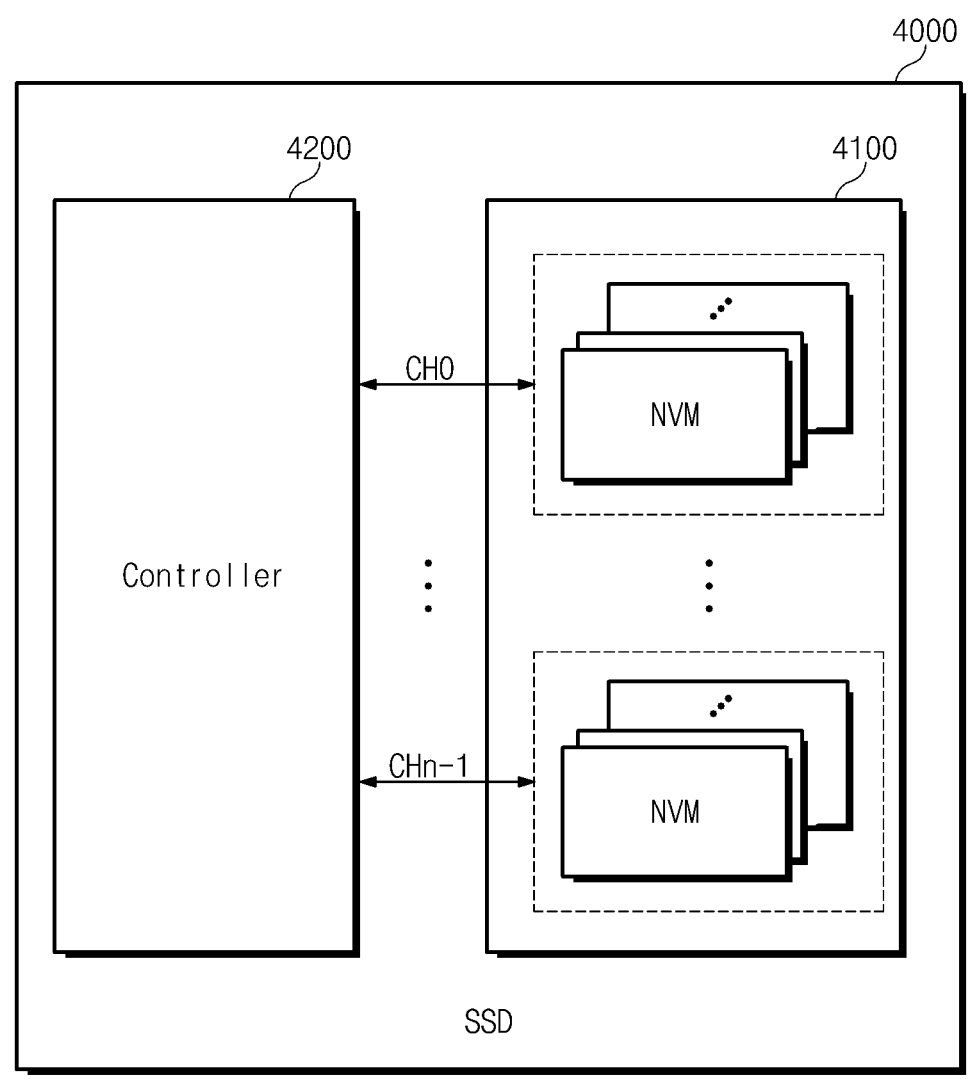
FIG. 21 is a block diagram showing a solid state drive according to exemplary embodiments.

FIG. 21 is a block diagram showing a solid state drive according to exemplary embodiments. Referring to FIG. 21, a solid state drive (SSD) 4000 may comprise a storage media 4100 and a controller 4200.

The storage media 4100 may be connected with the controller 4200 via a plurality of channels, each of which is commonly connected with a plurality of nonvolatile memories. Each nonvolatile memory device may be formed of a memory such as described in FIG. 4. The controller 4200 may be configured to control the storage media 4100 according to any one of programming manners described above with reference to FIGS. 5 to 13. As a result, a size of a buffer memory included in the controller 4200 can be minimized.

Figure 22:
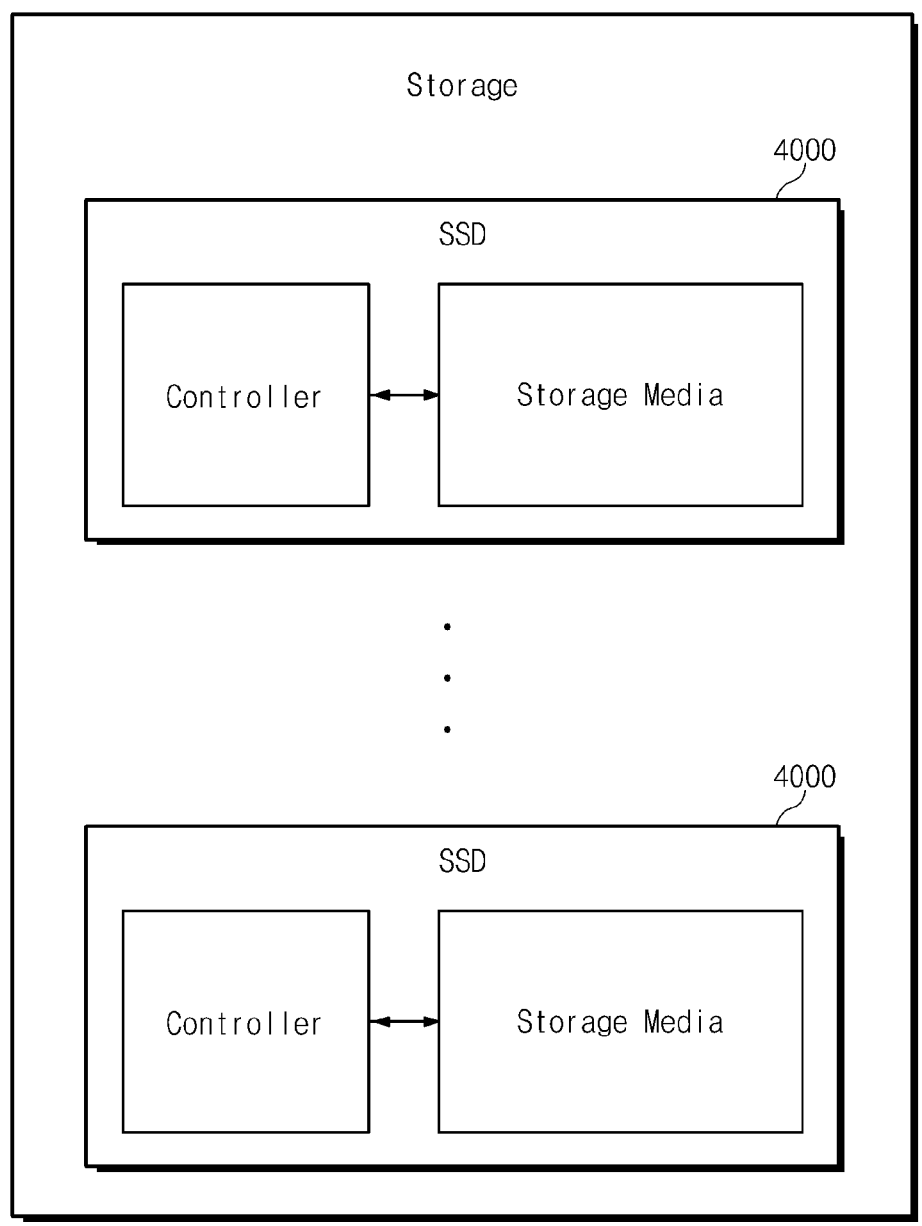
FIG. 22 is a block diagram showing a storage using a solid state drive in FIG. 21 according to certain exemplary embodiments.
Figure 23:
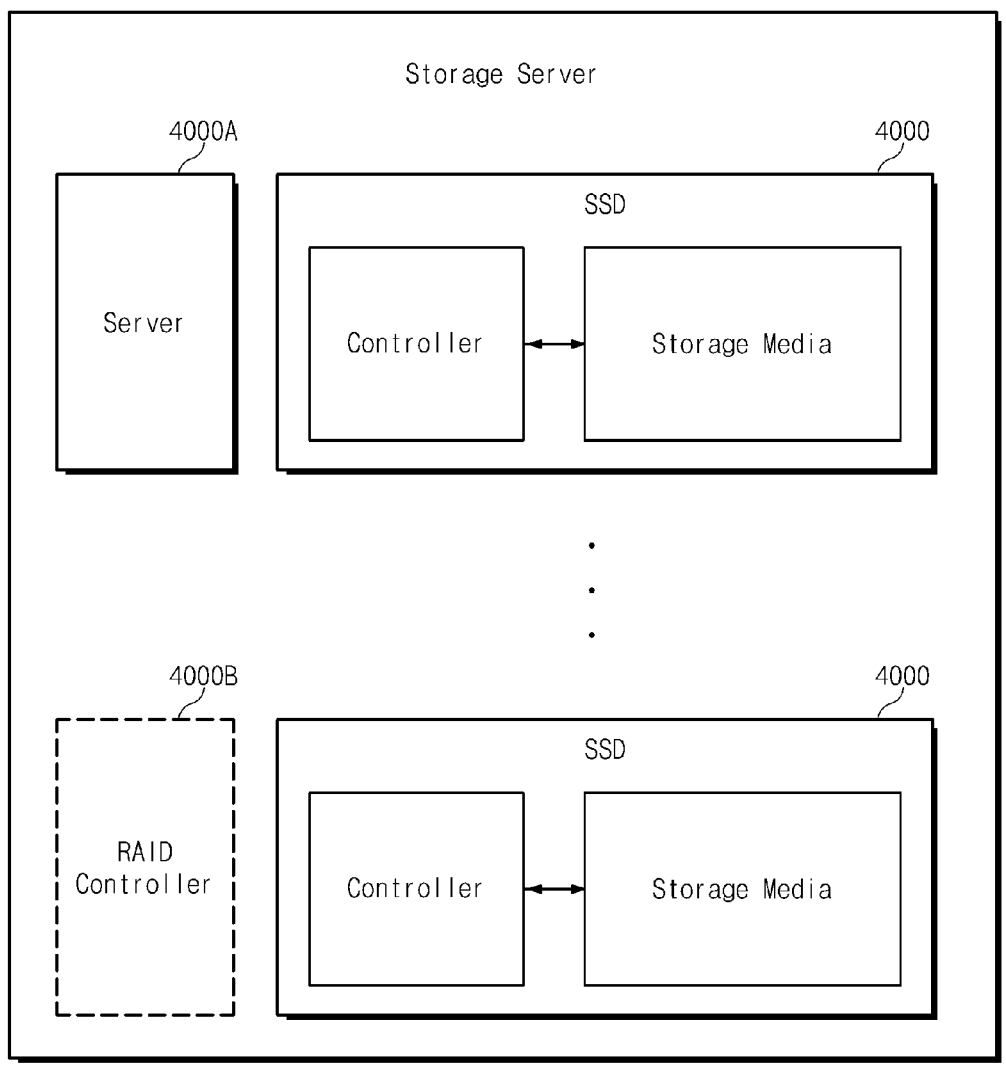
FIG. 23 is a block diagram showing a storage server using a solid state drive in FIG. 21 according to certain exemplary embodiments.

FIG. 22 is a block diagram showing a storage using a solid state drive in FIG. 21, and FIG. 23 is a block diagram showing a storage server using a solid state drive in FIG. 21, according to certain embodiments.

An SSD 4000 according to an exemplary embodiment may be used to form the storage. As illustrated in FIG. 22, the storage may include a plurality of solid state drives 4000 which are configured the same as described in FIG. 21. An SSD 4000 according to an exemplary embodiment may be used to configure a storage sever. As illustrated in FIG. 23, an exemplary storage server includes a plurality of solid state drives 4000, which may be configured the same as described in FIG. 21, and a server 4000A. Further, it is well comprehended that a well-known RAID controller 4000B may be provided in the storage server.

Figure 24:
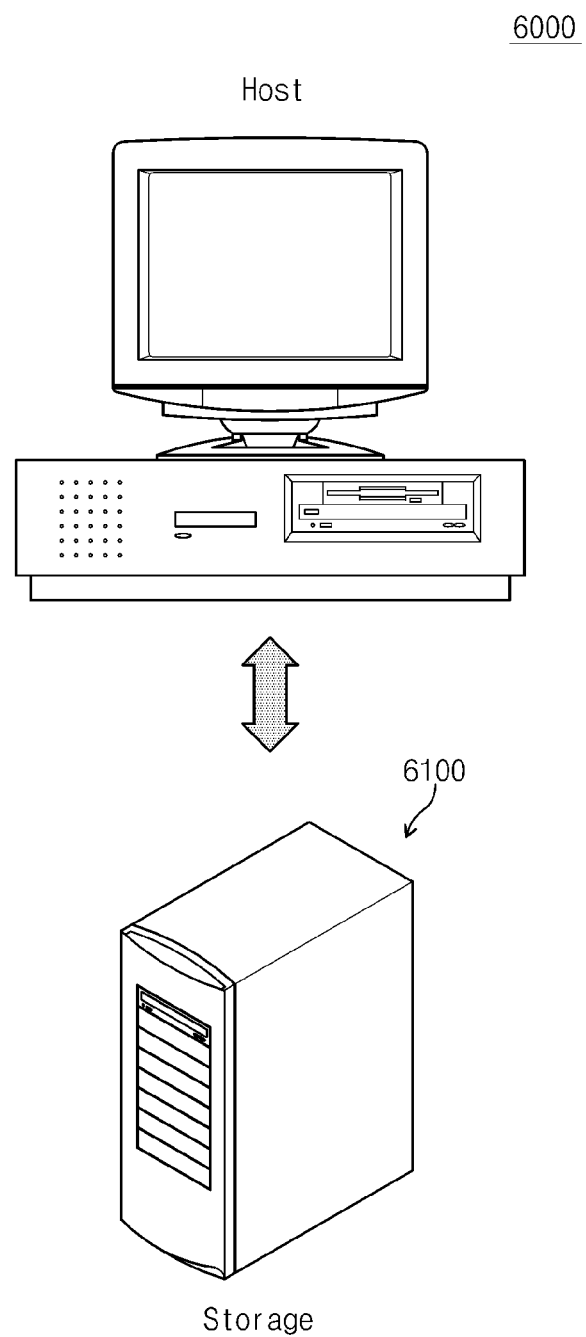
FIGS. 24 to 26 are diagrams showing systems to which a data storage device according to exemplary embodiments.
Figure 25:
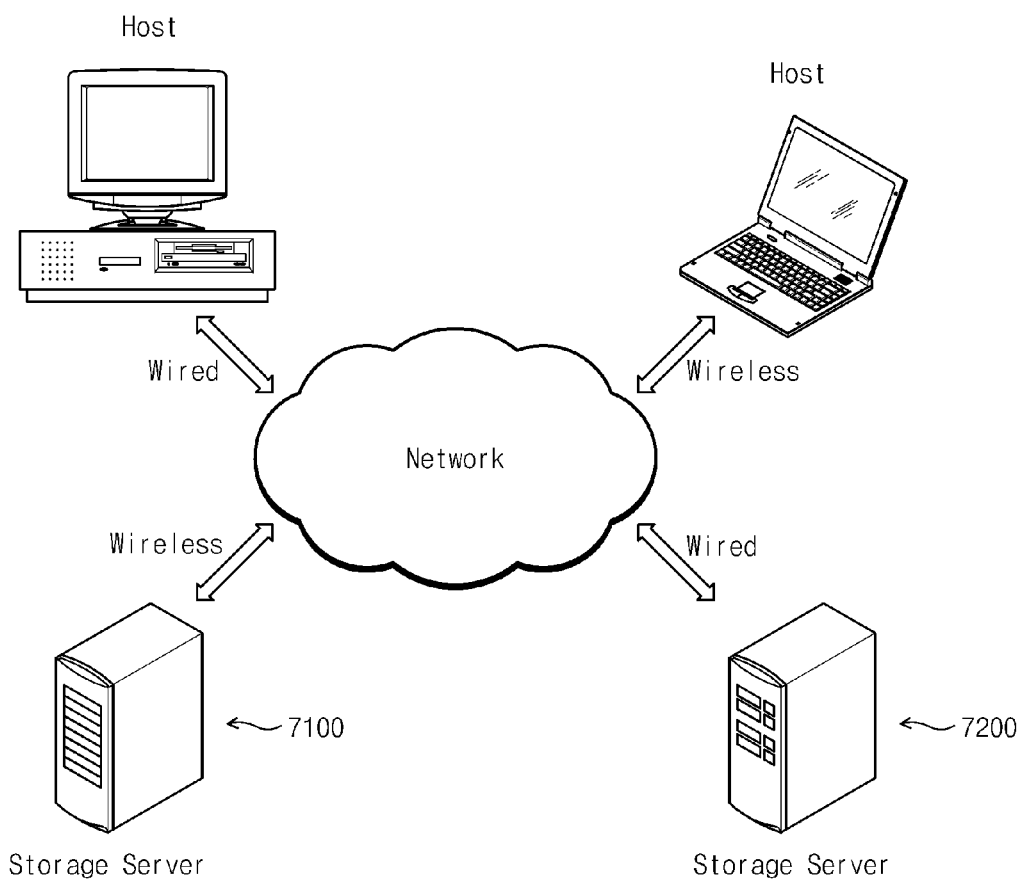
Figure 26:
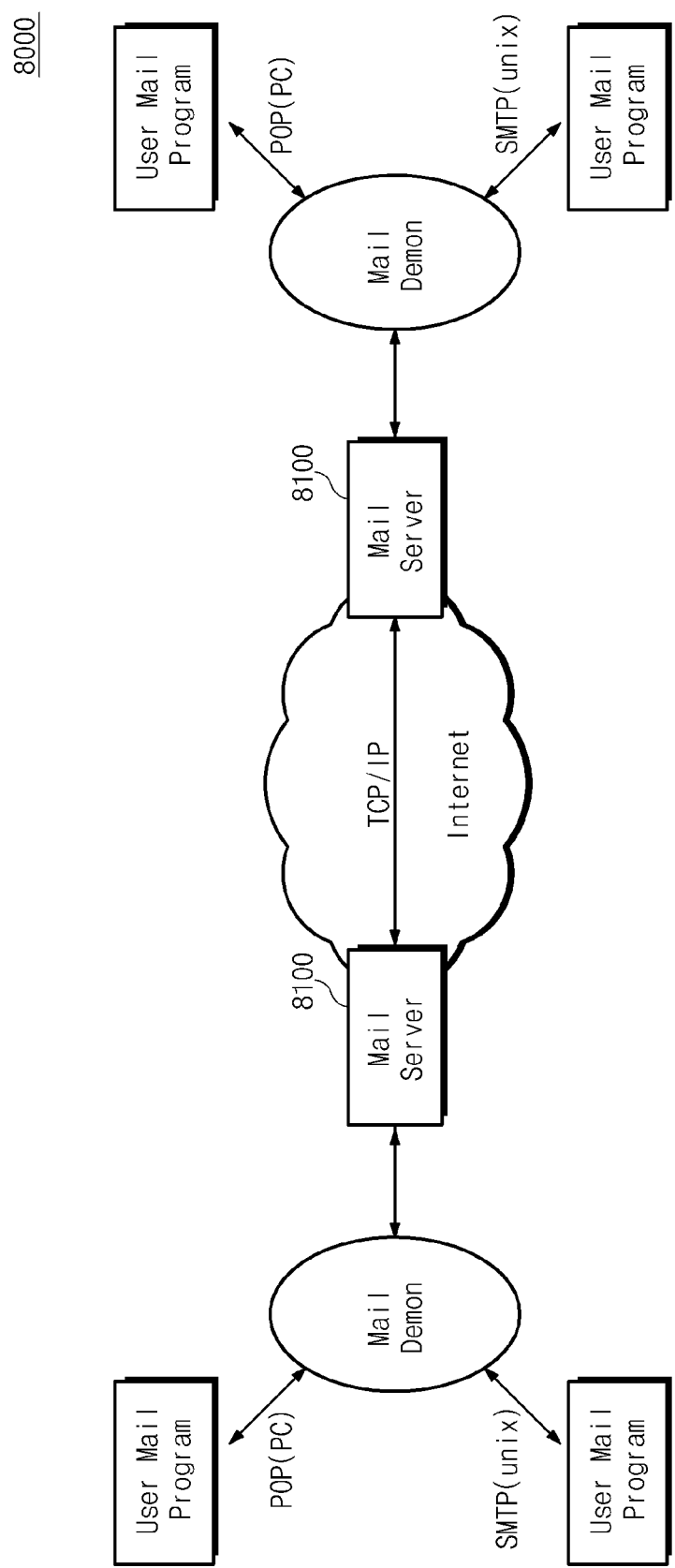

FIGS. 24 to 26 are diagrams showing systems to which a data storage device according to exemplary embodiments may be applied.

In the event that a solid state drive including a data storage device formed of a memory controller and a multi-bit memory device according to exemplary embodiments is applied to the storage, as illustrated in FIG. 24, a system 6000 may include a storage 6100 which communicates with a host by a wire or wireless manner. In a case where a solid state drive including a data storage device according to exemplary embodiments is applied to a storage server, as illustrated in FIG. 25, a system 7000 may include a storage servers 7100 and 7200 which communicate with a host by a wire or wireless manner (e.g., over a network such as an intranet or the Internet). Further, as illustrated in FIG. 26, a solid state drive including a data storage device according to exemplary embodiments can be applied to a mail server 8100.

Figure 27:
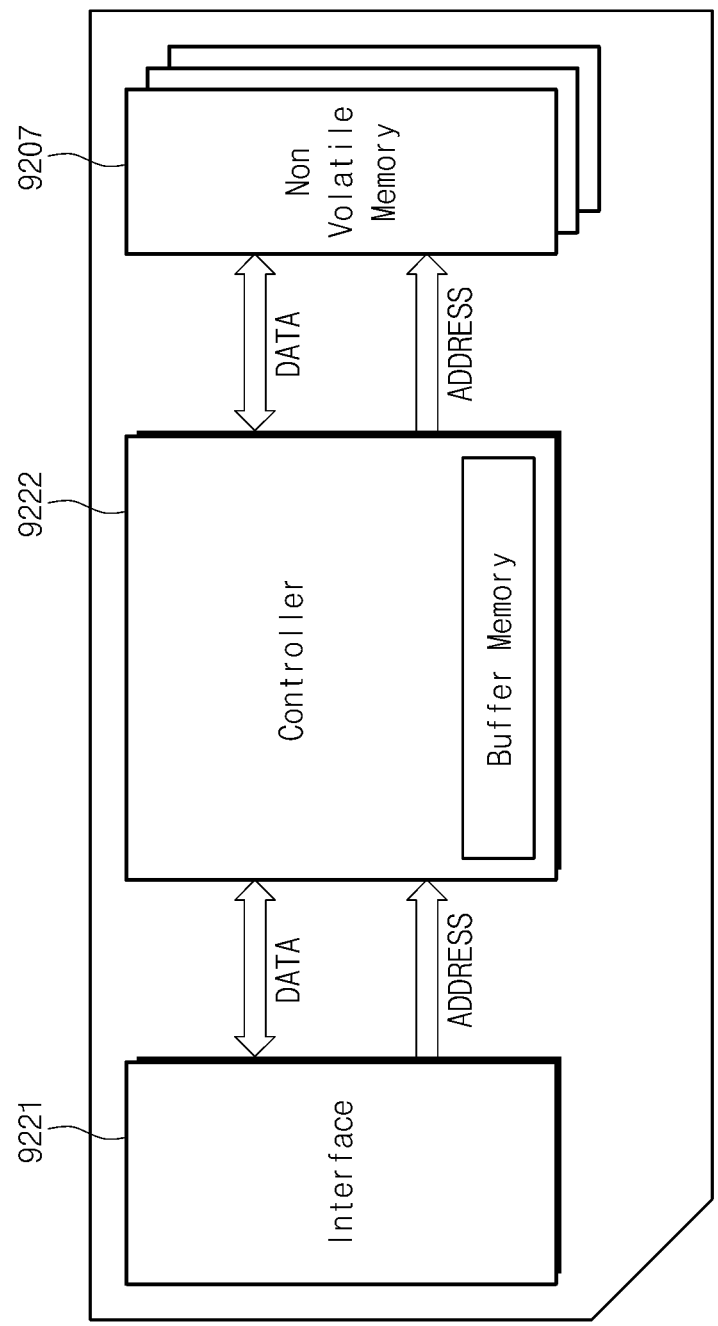
FIG. 27 is a block diagram illustrating a memory card according to exemplary embodiments.

FIG. 27 is a block diagram illustrating a memory card according to exemplary embodiments.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 27, the memory card may include an interface circuit 9221 for interfacing with an external device, a controller 9222 including a buffer memory and controlling an operation of the memory card, and at least one nonvolatile memory device 9207 according to embodiments discussed above. The controller 9222 may be coupled with the nonvolatile memory device 9207 and the interface circuit 2221 via a data bus and an address bus.

As a processor, the controller 9222 may control program and read operations of the nonvolatile memory device 9208. The controller 9222 and the non-volatile memory device 9207 may correspond to a controller 120 and a multi-bit memory device 130 described in FIG. 4, respectively. The controller 9222 may be configured to control the non-volatile memory device 9207 according to any one of programming manners described above with reference to FIGS. 5 to 13. This means that a size of a buffer memory included in the controller 9222 can be minimized.

Figure 28:
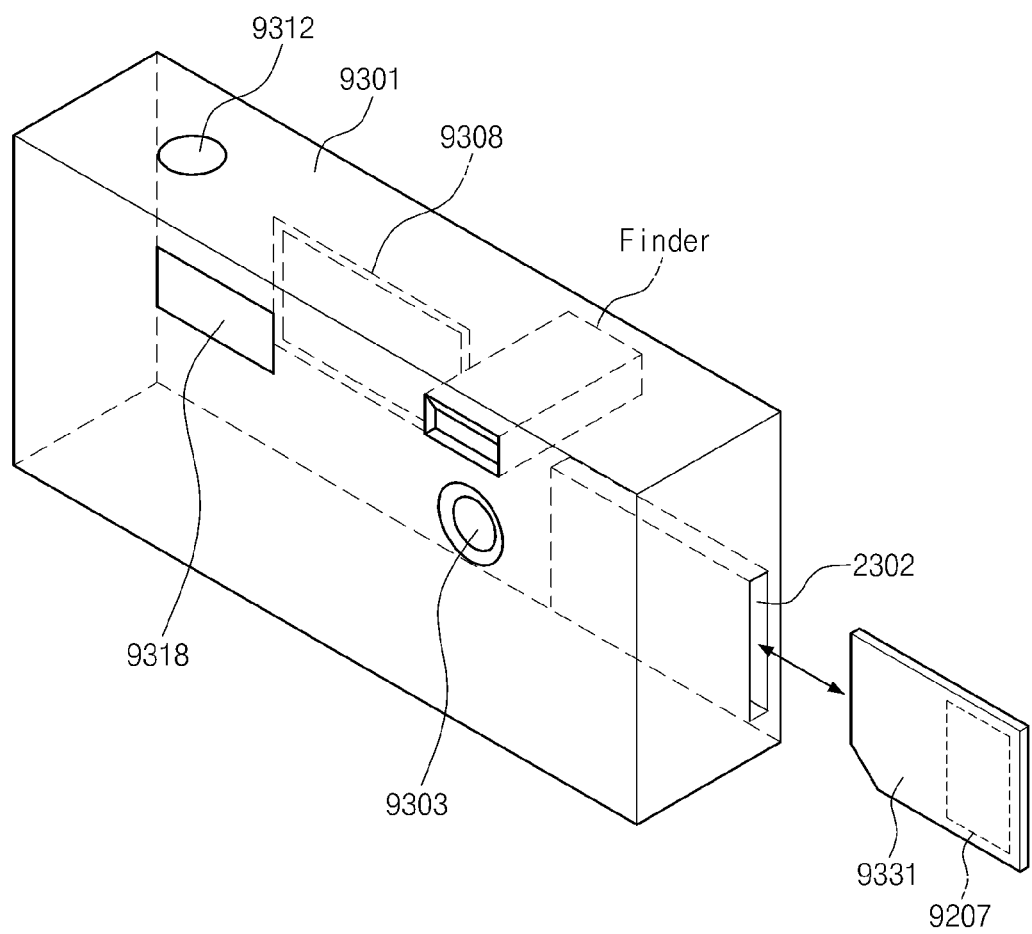
FIG. 28 is a block diagram illustrating a digital still camera according to exemplary embodiments.

FIG. 28 is a block diagram illustrating a digital still camera according to certain embodiments.

Referring to FIG. 28, a digital still camera may include a body 9301, a slot 9302, a lens 9303, a display circuit 9308, a shutter button 9312, a strobe 9318, and the like. In particular, a memory card 9331 may be inserted in the slot 9308 and include a memory controller 120 and a multi-bit memory device 130 described in FIG. 4.

The memory controller in the memory card 9331 may be configured to control the multi-bit memory device therein according to any one of programming manners described with reference to FIGS. 5 to 13. This means that a size of a buffer memory included in the memory controller can be minimized.

If the memory card 9331 has a contact type, an electric circuit on a circuit board may be electrically contacted with the memory card 9331 when it is inserted in the slot 9308. In the event that the memory card 9331 has a non-contact type, an electric circuit on a circuit board may communicate with the memory card 9331 in a radio-frequency manner. Although a digital still camera is depicted, the same principles and elements could be used in a camera that records moving pictures (i.e., video).

Figure 29:
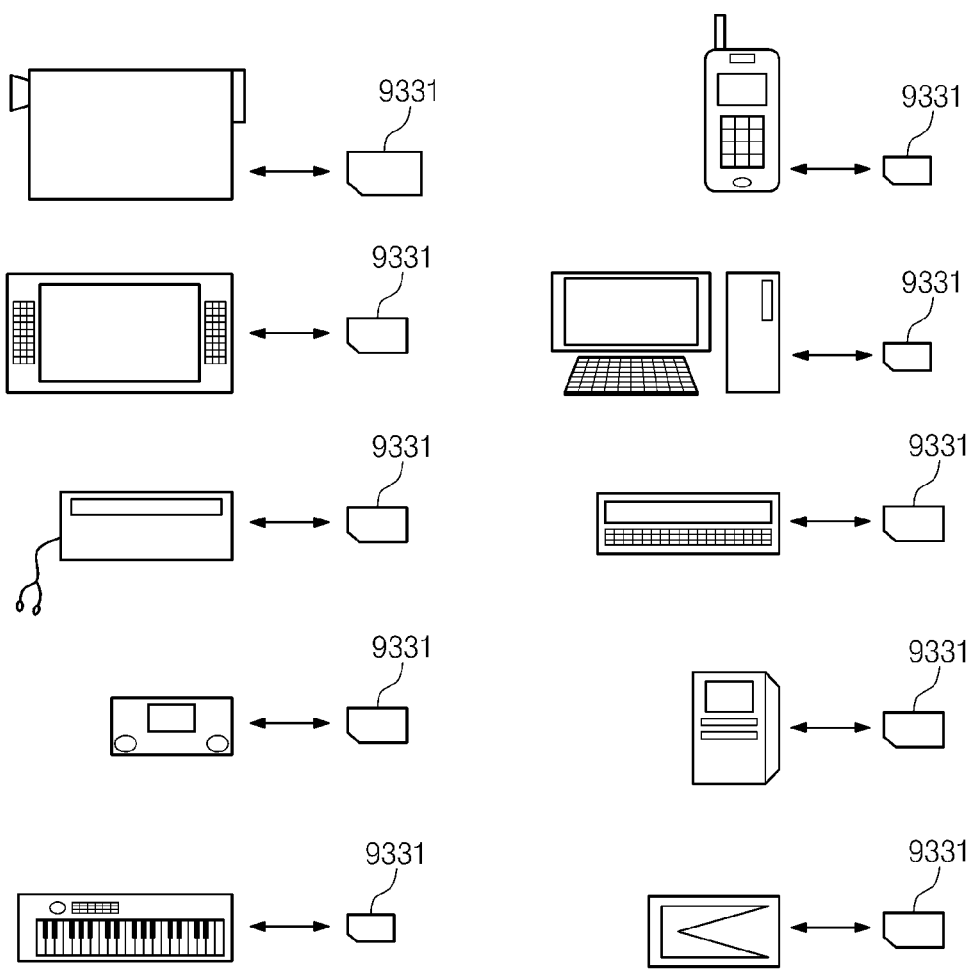
FIG. 29 is a diagram illustrating various systems to which a memory card in FIG. 28 is applied according to certain exemplary embodiments.

FIG. 29 is a diagram illustrating various systems to which a memory card in FIG. 28 may be applied.

Referring to FIG. 29, a memory card 9331 may be applied to a video camera, a television, an audio device, a game machine, an electronic music device, a cellular phone, a computer, a Personal Digital Assistant (PDA), a voice recorder, a PC card, and the like.

A nonvolatile memory device and/or a memory controller according to the disclosed embodiments may be packed using various types of packages. For example, A non-volatile memory device or a memory controller according to certain embodiments may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, the scope is to be determined by the broadest permissible interpretation of the following claims and their equivalents, and shall not be restricted or limited by the foregoing detailed description.

What is claimed is:

1. A data storage system comprising:
   a nonvolatile memory device including a memory cell array; and
   a memory controller configured to control the nonvolatile memory device,
   wherein the memory cell array includes a first region configured for storing up to N−1-bit data (N being an integer greater than 1) per memory cell and a second region configured for storing N-bit data per memory cell, the first region including N memory blocks;
   wherein the memory controller is configured to control the nonvolatile memory device to perform a buffer program operation in which N-bit data to be stored in the second region is divisionally stored in the N memory blocks of the first region, and a main program operation in which the N-bit data stored in the first region is stored in the second region; and
   wherein the memory controller is configured to control the nonvolatile memory device to divisionally store, during the buffer program operation, the N-bit data at a word line of each of the N memory blocks of the first region disposed at the same relative location, with respect to each block, as a word line of the second region in which the N-bit data is to be stored.

2. The data storage system of claim 1, wherein the memory controller comprises a buffer memory; and
   wherein the memory controller is configured to:
   cause the buffer program operation to occur after data of a minimum program unit of the first region is stored in the buffer memory, and
   during the buffer program operation, control the nonvolatile memory device such that data stored in the buffer memory is stored in the first region.

3. The data storage system of claim 2, wherein the memory controller is configured to:
   cause the main program operation to occur after data of a minimum program unit of the second region is stored in the first region, and
   during the main program operation, control the nonvolatile memory device such that data stored in the first region is stored in the second region.

4. The data storage system of claim 1, wherein the main program operation includes at least one of a 1-step program operation, a coarse program operation, and a fine program operation.

5. The data storage system of claim 1, wherein the first region is configured to be programmed according to a single-bit program manner and the second region is configured to be programmed according to a multi-bit program manner.

6. The data storage system of claim 1, wherein the first region includes only N memory blocks, and N is identical to the number of bits that the nonvolatile memory device is configured to store in each memory cell of the second region.

7. The data storage system of claim 1, wherein:
   each block of the N memory blocks of the first region includes K word lines, and the second region includes K word lines.

8. An operating method of a data storage system that includes a nonvolatile memory device having a memory cell array divided into a first region and a second region, and a memory controller configured to control the nonvolatile memory device, the operating method comprising:
   performing a first program operation in which N-bit data (N being a positive integer greater than 1) to be stored in the second region is divisionally stored in each of at least N memory blocks included in the first region; and
   performing a second program operation in which the N-bit data stored in the first region is stored in the second region,
   wherein performing the first program operation includes divisionally storing the N-bit data at a word line of each of the N memory blocks of the first region disposed at the same location relative to the memory block in which it is included as a word line of the second region in which the N-bit data is to be stored.

9. The operating method of claim 8, wherein performing the second program operation comprises:
   sequentially reading the N-bit data stored in the first region from the N memory blocks; and
   storing the read N-bit data in the second region.

10. The operating method of claim 8, wherein the second program operation is performed by at least one of a 1-step program operation, a coarse program operation, and a fine program operation.

11. The operating method of claim 8, further comprising:
    outputting a mode switching command for use in the first program operation to the nonvolatile memory device before a set of program commands for the first program operation are output to the nonvolatile memory device.

12. The operating method of claim 11, wherein when the second program operation is carried out, the set of commands output to the nonvolatile memory device comprises a read command for the first region and a program command for the second region.

13. The operating method of claim 12, further comprising:
    outputting a mode switching command for ending of the first program operation to the nonvolatile memory device after the second program operation is carried out.

14. The operating method of claim 8, wherein each of memory cells of the first region stores M-bit data and each of memory cells of the second region stores N-bit data, M being less than N.

15. The operating method of claim 14, wherein the first region is programmed according to a single-bit program manner and the second region is programmed according to a multi-bit program manner.

16. A method for a data storage system, the method including:
providing a memory cell array;
providing N blocks in a first region of the memory cell array, N being an integer greater than 1, wherein:
each cell of each block of the N blocks is configured to store no more than N−1 bits of data;
providing a block in the second region of the memory cell array, wherein:
each cell of the block in the second region is configured to store N bits of data; and
configuring the data storage system so that when data is programmed to the memory cell array, N pages of the data are initially stored in N respective blocks of the first region of the memory cell array, and then the N pages of the data are stored in the block of the second region.

17. The method of claim 16, wherein:
each block of the N blocks includes K word lines, and
the block in the second region includes K word lines.

18. The method of claim 17, further comprising:
configuring the data storage system so that when data is programmed to the memory cell array, the N pages of the data are initially stored in Mth word lines of each of the N respective blocks of the first region of the memory cell array, and then the N pages of the data are stored in an Mth word line of the block of the second region.

19. The method of claim 16, wherein storing the N pages of the data in the block of the second region includes reading the N pages of the data from the N blocks of the first region, and then programming the data read from the N blocks of the first region to the block of the second region.

20. The method of claim 16, wherein the memory cell array comprises one or more layers of memory cells that are part of a semiconductor chip or a package including stacked semiconductor chips.

* * * * *